(12) United States Patent
Farah

(10) Patent No.: US 9,831,363 B2
(45) Date of Patent: Nov. 28, 2017

(54) LASER EPITAXIAL LIFT-OFF OF HIGH EFFICIENCY SOLAR CELL

(71) Applicant: John Farah, Attleboro, MA (US)

(72) Inventor: John Farah, Attleboro, MA (US)

( * ) Notice: Subject to any disclaimer, the term of this patent is extended or adjusted under 35 U.S.C. 154(b) by 567 days.

(21) Appl. No.: 14/309,812

(22) Filed: Jun. 19, 2014

(65) Prior Publication Data

US 2015/0368833 A1    Dec. 24, 2015

(51) Int. Cl.
*C30B 23/00* (2006.01)
*H01L 31/0304* (2006.01)
*H01L 31/18* (2006.01)
*H01L 31/0687* (2012.01)
*C30B 33/06* (2006.01)
*B23K 26/402* (2014.01)
*B23K 26/082* (2014.01)
(Continued)

(52) U.S. Cl.
CPC .... *H01L 31/03046* (2013.01); *B23K 26/0624* (2015.10); *B23K 26/082* (2015.10); *B23K 26/402* (2013.01); *B23K 26/53* (2015.10); *C30B 33/06* (2013.01); *H01L 31/03926* (2013.01); *H01L 31/0687* (2013.01); *H01L 31/06875* (2013.01); *H01L 31/184* (2013.01); *H01L 31/1892* (2013.01); *B23K 2203/172* (2015.10); *B23K 2203/50* (2015.10); *B23K 2203/54* (2015.10); *C30B 29/40* (2013.01); *Y02E 10/544* (2013.01)

(58) Field of Classification Search
USPC .............................................. 117/90, 94, 915
See application file for complete search history.

(56) References Cited

U.S. PATENT DOCUMENTS 4,774,194 A  *  9/1988  Hokuyou ............ H01L 31/0693
                                                    117/105
7,759,607 B2    7/2010  Chism
(Continued)

FOREIGN PATENT DOCUMENTS

GB        2467934 A       8/2010

OTHER PUBLICATIONS

V. Dragoi, et al, Adhesive wafer bonding for MEMS applications, Smart Sensors, Actuators, and MEMS, Proceedings of SPIE vol. 5116, pp. 160-167, 2003.

(Continued)

*Primary Examiner* — Nina Bhat

(57) ABSTRACT

An epitaxially grown III-V layer is separated from the growth substrate. The III-V layer can be an inverted lattice matched (ILM) or inverted metamorphic (IMM) solar cell, or a light emitting diode (LED). A sacrificial epitaxial layer is embedded between the GaAs wafer and the III-V layer. The sacrificial layer is damaged by absorbing IR laser radiation. A laser is chosen with the right wavelength, pulse width and power. The radiation is not absorbed by either the GaAs wafer or the III-V layer. No expensive ion implantation or lateral chemical etching of a sacrificial layer is needed. The III-V layer is detached from the growth wafer by propagating a crack through the damaged layer. The active layer is transferred wafer-scale to inexpensive, flexible, organic substrate. The process allows re-using of the wafer to grow new III-V layers, resulting in savings in raw materials and grinding and etching costs.

20 Claims, 36 Drawing Sheets

(51) Int. Cl.
| | |
|---|---|
| *B23K 26/53* | (2014.01) |
| *B23K 26/0622* | (2014.01) |
| *H01L 31/0392* | (2006.01) |
| *C30B 29/40* | (2006.01) |
| *B23K 103/16* | (2006.01) |
| *B23K 103/00* | (2006.01) |

(56) References Cited

U.S. PATENT DOCUMENTS

| | | | |
|---|---|---|---|
| 7,994,419 B2* | 8/2011 | Pan | H01L 31/1852 136/255 |
| 9,068,278 B2* | 6/2015 | He | C30B 29/40 |
| 9,165,805 B2* | 10/2015 | Gmitter | H01L 21/67092 |
| 2002/0068201 A1* | 6/2002 | Vaudo | C30B 25/02 428/704 |
| 2005/0003641 A1* | 1/2005 | Faure | C30B 25/18 438/509 |
| 2008/0258133 A1* | 10/2008 | Seong | H01L 33/04 257/14 |
| 2011/0294281 A1* | 12/2011 | Zang | H01L 21/0237 438/478 |
| 2012/0055540 A1* | 3/2012 | Yamaguchi | H01L 31/048 136/251 |
| 2013/0043214 A1 | 2/2013 | Forrest et al. | |
| 2014/0326300 A1* | 11/2014 | Fuhrmann | H01L 31/1892 136/255 |

OTHER PUBLICATIONS

J. C. Miller & R. F. Haglund, Laser Ablation and Desorption, Academic Press, New York, 1998.
Matthew S. Brown and Craig B. Arnold, Chapter 4, Chapter 8, K. Sugioka et al., Springer Series in Materials Science 135, Springer-Verlag Berlin Heidelberg 2010.
Clark-MXR, Michigan, Micromachining Handbook http://www.cmxr.com/Education/Ultrafast.html.
Lonnie Lucas and Jim Zhang, http://www.industrial-lasers.com/articles/print/volume-27/issue-04/features/fermtosecond.
X. Liu, D. Du, G. Mourou, IEEE J. Quantum Electron. 33(10), p. 1706, 1997.
D. Chattopadhyay and P.C. Rakshit, Electronics (Fundamentals and Applications), New Age International Publishers, 7th Ed. 2006.
B. C. Stuart, M. D. Feit, S. Herman, A. M. Rubenchik, B. W. Shore, and M. D. Perry, Physical Review B vol. 53, No. 4 Jan. 15, 1996—II.
R. Newman and W.W. Tyler, Solid State Physics 8, 49, 1959.
T. J.Wagner, PhD thesis, Air Force Institute of Technology, 2010.
E. Yablonovitch, Final Report, NREL/SR-520-26903, Nov. 1999.
J. J. Schermer, et al, Phys. stat. sol. (a) 202, No. 4, 501-508, 2005.
Rao Tatavarti, et al, 978-1-4244-1641-7/08 IEEE 2008.
S. Bedell et al, Kerf-less Removal of Si, Ge and III-V Layers by Controlled Spalling, 5th International Workshop on Crystalline Silicon Solar Cells—CSSC-5, Nov. 2011.
J. Vaes et al, Slim-Cut Thin Silicon Wafering with enhanced crack and stress control, SPIE vol. 7772-12, 2010.
F. Dross et al, Method for the Production of Thin Substrate, Patent Application Pub No. US 2010/0323472 A1, Dec. 23, 2010.
D. Jawarani et al, 5th International Workshop on Crystalline Silicon Solar Cells—CSSC-5, Nov. 1-3, 2011, Boston, MA.
K. Wasmer et al, Part I: Scratching operation, Journal of Materials Processing Technology, vol. 198, Issues 1-3, pp. 105-113, Mar. 3, 2008.
K. Wasmer et al, Part II. Cleavage operation, Journal of Materials Processing Technology, vol. 198, Issues 1-3, pp. 114-121, Mar. 3, 2008.
C.B. Schaffer, J.F. Garcia, E. Mazur, Bulk heating of transparent materials using a high-repetition-rate femtosecond laser, Appl. Phys. A 76, 351-354, 2003.
W. C. Hurlbut, et al, Optics Letters, Multiphoton absorption and nonlinear refraction of GaAs in the mid-infrared, vol. 32, No. 6, Mar. 15, 200.
S. Bowden, et al, Laser wafering, 38th PhotoVoltaic Specialists Conference 2012 www.ieee-pvsc.org.
Benjamin M. Cowan, SLAC-PUB-12960 AARD-493, Nov. 2007 Presented at Boulder Damage Symposium XXXIX, Boulder, CO, Sep. 24-26, 2007.
http://www.mse.berkeley.edu/groups/Sands/HEMI/Liftoff.html.
S. Oktyabrsky, et al, Appl. Phys. Lett. 85(1), p. 151-153, 2004.
A. Cavalleri, et al, Physical Review B, vol. 63, 193306, 2001.
Omer Salihoglu, et al, Femtosecond laser crystallization of amorphous Ge, Journal of Applied Physics 109, 123108, 2011.
Srini Krishnamurthy, Zhi Gang Yu, Leonel P. Gonzalez, and Shekhar Guha, J. Appl. Phys. 109, 033102, 2011.
Hernando Garcia and Kobra Nasiri Avanaki, Direct and indirect two-photon absorption in Ge within the effective mass approximation, Appl. Phys. Lett. 100, 131105, 2012.
D. Seo, J. M. Gregory, L. C. Feldman, N. H. Tolk, and P. I. Cohen, Physical Review B 83, 195203, 2011.
Seong Shan Yap, et al, Nanosecond laser ablation and deposition of Ge films, Proc. of SPIE vol. 776614-1, Nanostructured Thin Films III, http://spiedigitallibrary.org/, 2010.
W. C. Hurlbut, et al, Optics Letters, Multiphoton absorption and nonlinear refraction of GaAs in mid-infrared, vol. 32, No. 6, Mar. 15, 2000.

* cited by examiner

PRIOR ART

Inverted metamorphic triple junction solar cell (IMM)

* not drawn to scale

Lattice matched inverted triple junction solar cell (LMI)

\* not drawn to scale

PRIOR ART

PRIOR ART

PRIOR ART

PRIOR ART

PRIOR ART

PRIOR ART

PRIOR ART
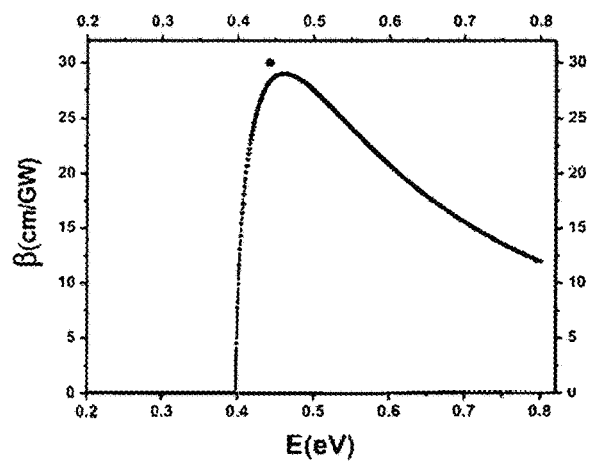
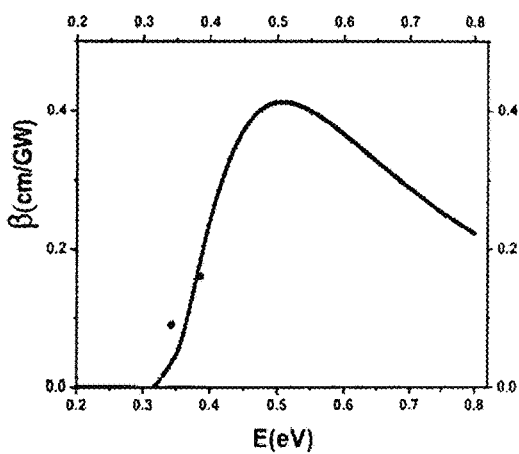
Fig 23a
Fig 23b

PRIOR ART

(2) Series Connection - Var. 2

Cell Integration

LASER EPITAXIAL LIFT-OFF OF HIGH EFFICIENCY SOLAR CELL

RELATED APPLICATIONS

This application claims priority under 35 U.S.C. §119(e) to U.S. Provisional Application Ser. No. 61/836,255 entitled "Laser Epitaxial Lift-Off of High Efficiency Solar Cell" filed on Jun. 18, 2013, which is herein incorporated by reference in its entirety.

BACKGROUND OF THE INVENTION

Field of the Invention

This invention applies to epitaxially grown solar cells and specifically to inverted solar cell structures. Inverted metamorphic III-V multi junction solar cells achieve the highest efficiencies (>30% in space and >40% terrestrial under concentrator). These cells are grown epitaxially on GaAs wafers that are up to 700 µm thick. The solar photons are absorbed in the epitaxial layer, which is about 10 µm thick. The substrate is only for mechanical support and considered wasted from a materials point of view. It is desired to lift-off the epi-layer and transfer to flexible polyimide substrate and to reuse the GaAs wafer to grow another epi-layer multiple times. The cost of materials to produce a GaAs wafer suitable for a solar cell is about $50 per Watt. This accounts for about 40% of the cost of the finished cell. There is a need to make high efficiency solar cells thin, lightweight and flexible to achieve high specific power (>200 W/Kg); and foldable so that they can be stowed in a small volume to increase payload space. A new cost-effective dry lift-off process which transfers the active cell layer wafer-scale to a less expensive flexible substrate without ion implantation or chemical etching is presented. This yields thin high efficiency solar cells which have the same performance on the host substrate as on the growth substrate and which are easily scalable to large size arrays. This process allows re-using of the base semiconductor wafer to grow new cells which results in savings in GaAs materials, grinding and etching expenses. This technology reduces the cost of the cell by 30% and allows a very rapid growth of the terrestrial market for high efficiency III-V solar cells.

The savings are not only monetary. This has huge implications on natural resources. Gallium is the rarest component of the photovoltaic compounds. All the newly developed solar cell materials, such as CIGS, contain Gallium. As the substrate must currently be ground away for the epitaxial lift-off, 12% of the world's current Ga production from mining goes to waste. This creates one of the most expensive toxic wastes because GaAs contains 48% Ga and 52% arsenic, which is toxic. Thus, cost is not the only issue but also availability of the material. Therefore, this technology solves the bottleneck in the Ga supply chain and will have broad impact on society and the ecology.

The base wafer accounts for 40% of the cost of a finished cell. Thus, reducing the materials used in solar cells will go a long way toward reducing the overall cost of the cell. This can be achieved by transferring the epi-layer to a cheaper substrate and reusing the wafer to grow another epi-layer. This would achieve the lowest cost, while preserving rare earth materials.

Discussion of Related Art

Wet epitaxial lift-off (WELO) has been demonstrated by incorporating a lattice-matched sacrificial release layer, such as $Al_{0.7}Ga_{0.3}As$, under the epi-layer, which gets etched off chemically in HCl or HF [1,2,3]. It takes up to several hours to free a GaAs layer from its growth substrate due to the restricted access of the etchant to the AlGaAs layer, especially for large size wafers. This is considered too slow for industrial utilization. It should take only seconds per wafer to be viable for large scale manufacturing. Therefore, a technique for quicker peel-off that would have wider industrial application is needed.

Solar cell manufacturers prefer to grow lattice-matched structures in order to minimize slips and dislocations which can degrade the performance of the solar cell. Nevertheless, thick epi-layers can be grown on strained layers, such as $In_{0.3}Ga_{0.7}As$, if the thickness of the strained layer is kept below the critical thickness, which for 2% strain is 50 mono-layers or about 10 nm. Lattice-matched InGaP etch stop layers are grown routinely under triple junction solar cells.

There were several recent attempts in the industry by IBM [4], IMEC [5,6] and AstroWatt [7] to slice a wafer from ingot kerflessly using a technique called "spalling". These efforts concentrated mainly on silicon. A thick metallic stressor layer, usually Ni, is deposited on the semiconductor wafer and heated at very high temperature >800° C. The stress caused by the difference in the coefficients of thermal expansion between metal and semiconductor as the wafer cools to room temperature exceeds the toughness of the material and causes a crack to propagate in the substrate parallel to the surface at a certain depth below the interface. This causes a thin layer to separate from the base substrate and remain stuck to the metal film. A high peak temperature is necessary to cause the stresses. This enhances the diffusion of impurities from the metal into the silicon which act as recombination centers for electron-hole pairs and lower the efficiency [5,6]. Further, the high temperature affects the morphology of the crystal which causes the crack to propagate uncontrollably. As a result, the depth at which the cleavage occurs cannot be controlled precisely and the surface is rough. The metal layer is dissolved which yields a 25 µm free standing silicon foil. A solar cell is subsequently fabricated in the silicon foil. Foils up to 150 cm² area have been fabricated [7]. The extracted foil is not supported and is therefore brittle and prone to chipping. Nevertheless, single junction solar cells fabricated in the foil exhibited similar performance to identical cells on bulk substrates which indicates that the quality of the crystal is not compromised by the lift-off. The highest efficiency that has been demonstrated on these foils is 15% [7].

The (110) is the preferred cleavage plane in GaAs. However, solar cell manufacturers are reluctant to grow on (110) wafers because most of the industry is built on (100) wafers, albeit with large off-cut angles up to 15° toward the (111)A plane.

The ultimate goal of all lift-off techniques is to re-use the base wafer after lift-off.

Laser micromachining inside the bulk of materials is not new. It is used for making waveguides inside transparent materials (glass) [10], and has been proposed as a way for wafering silicon from ingot [11]. These techniques depend on non-linear absorption at the focal point, forming a sub-surface defect while leaving the region between the surface and the defect untouched. Light from an IR laser at a wavelength above 1 µm is focused below the surface and scanned across the wafer. The size of the defect depends on the depth of focus. This requires the use of large diffraction limited lenses with short focal lens and low f# and necessitates the use of high precision and resolution vertical positioning stages, which are expensive. Silicon does not benefit from heterogeneous epitaxial growth where separation of the epi-layer from the wafer can be done using a sacrificial layer at the interface, and therefore, wafering in silicon relies more on the quality and precision of the optics rather than the physics of absorption.

The crystallographic structure of Si has been damaged by radiation in the NIR at 2256 nm with a threshold fluence of 0.18 J/cm$^2$ using sub-picosecond pulses [12]. This radiation should also damage Ge because it has weaker covalent bonds having a lower bandgap. Laser ablation is also used for epitaxial lift-off of GaN layers from sapphire substrates for the fabrication of LEDs [13].

It is desired to cleave at or very near the epi/wafer interface without sacrificing substrate material. That would be true epitaxial lift-off so that the original wafer is recovered at full thickness. III-V materials have the advantage that devices are fabricated in epitaxially-grown layers. Thus, the epi-layer can be peeled off the substrate and transferred to a flexible carrier and the substrate can be reused to grow another epi-layer. The fragile crystalline solar cell must be supported at all times. A suitable flexible carrier is polyimide Kapton® sheet which is backed by DuPont and qualified for space applications. Kapton is available in sheets as thin as 50 μm which are easy to handle and come pre-coated with a uniform layer of acrylic adhesive. It operates continuously from cryogenic to >200° C. which is suitable for space applications. A Kapton sheet with adhesive layer is bonded to the epi-side of GaAs wafer using a hot roll laminator and then cured in an oven at 150° C.-190° C. for about an hour. After lift-off the thin epi-layer is carried by the Kapton sheet which serves as permanent carrier of the IMM solar cell. The entire thickness of the thin solar cell is less than 100 μm, which meets the specific power requirements for space.

FIG. 1 shows a thin IMM3J epi-layer carried by polyimide substrate. It shows a smooth shiny surface of the InGaP etch stop layer. This can be obtained by lifting-off the epi-layer without sacrificing the growth wafer so that it can be re-used to grow another epi-layer. This solar cell was rolled mechanically to a radius <½" and shocked thermally without fracturing.

There are two ways to separate the epi-layer from the growth substrate kerflessly: either by 1) driving a crack at the interface due to thermal stresses, or 2) disintegrating a sacrificial layer by laser ablation. These two approaches involve different physics but lead to the same end result. Both are dry, meaning they are fast and there is no wet etching. These two concepts are illustrated in FIGS. 2a and 2b, respectively.

Dry Epitaxial Lift-Off (DELO)

The polyimide serves not only as the permanent carrier of the thin crystalline solar cell but also creates the thermal stresses that lead to cleavage. Kapton has a CTE of 18-20 ppm/° C. compared to 5-6 ppm/° C. for GaAs. The temperature is lowered by introducing the composite structure slowly in liquid nitrogen at −196° C. Within a minute, an audible crack initiates and the film snaps right off. A temperature differential ΔT∼300° C. (between the curing temperature and LN$_2$) and a CTE difference of 12-14 ppm/° C. cause a stress of about 20 MPA which is sufficient to initiate a crack because it is amplified at the crack tip. Crack nucleation is due solely to the build-up of thermal stresses without applying external mechanical force. The crack propagates across the wafer in a fraction of a second. The wafer cleaves spontaneously at a plane parallel to the bond interface. For GaAs the lift-off temperature is about −140° C. whereas for Si the wafer must be cooled down to −196° C. The lift-off happens in a split-second and was captured on video. The front side of the solar cell can be processed on the Kapton after lift-off. The concept applies to all semiconductor materials, Si, Ge, GaAs and InP, and to all epitaxially grown solar cells for space as well as terrestrial applications. The concept is illustrated in FIG. 3.

The sequence of frames in FIG. 4 taken from http://www.youtube.com/watch?v=B1tj5ZUe9TI show the backside of a GaAs wafer piece bonded to Kapton 50 μm thick on the front side (underneath), on a plate as it is lowered slowly in a dewar of liquid nitrogen. The successive pictures show the drop in temperature over the course of a few minutes until lift-off happened at a temperature of −140° C. As the lift-off temperature was reached the Kapton layer snapped off almost instantaneously. The curled peeled off epi-layer stuck to the Kapton sheet (brown) is shown in FIG. 4d sitting on top of the GaAs wafer piece.

The first two video clips show the rolling and unrolling of thin GaAs epitaxial layers on Kapton as it is thermally cycled between a hot plate at +100° C. and −196° C. The third video shows the lift-off wafer scale. The last video shows the lifted-off layer held on a standard vacuum chuck spinning at 3000 RPM which allows fabrication of the front side of the solar cell. These movies take less than a minute each:

http://www.youtube.com/watch?v=WED8cj2Yflw 1:33 min rolling and unrolling http://www.youtube.com/watch?v=U5rxiwkenmI 1:00 min rolling and unrolling http://www.youtube.com/watch?v=BJr1LDdZabg 0:48 min wafer scale lift-off happens at 40 seconds http://www.youtube.com/watch?v=VC6v7_RAOok 0:09 min GaAs on Kapton spinning at 3000 RPM The polyimide is very advantageous because it is able to induce lift-off for a temperature drop ΔT of only 300° C. compared to metal which requires raising to >800° C. Furthermore, it is completely inert and does not contaminate the semiconductor layer. This process is low temperature between +200° C. and −196° C. The combination of polyimide/adhesive is tough and can withstand these temperatures. The acrylic adhesive holds in liquid nitrogen and is able to transmit the force and break-off a layer of semiconductor wafer without losing its grip. The adhesive layer is applied uniformly to Kapton. It has a smooth surface and supports the epi-layer over the entire 4" wafer.

Cleavage by Crack Propagation Due to Thermal Stresses

The following is a summary of results obtained:
1) lifted-off a layer of GaAs 10-15 μm thick equivalent to IMM3J layer thickness,
2) cleaved 2" (110) and 4" (100) orientation wafers and saved the base wafer as one piece,
3) reused a base wafer and lifted-off another layer several times, there did not appear to be a limit to the number of reuses as long as the substrate remained thick enough,
4) obtained atomically smooth (mirror-like) surfaces (single atomic plane cleavage, roughness <1 nm) over areas (>1 cm$^2$) in (110) orientation wafer,
5) fabricated front side of solar cell on Kapton and demonstrated that the performance is not degraded compared to identical solar cell on GaAs wafer.

FIGS. 5 and 6 show the lifted-off layer on Kapton to the right and the base wafer to the left for GaAs (110) and (100), respectively. Uniform cleavage is obtained across 4" wafer. The (110) orientation yields smoother cleaved surface as expected. FIG. 7 shows AFM average roughness of 0.059 nm, below instrument noise, indicating that the cleavage is a single atomic plane.

A GaAs wafer bonded to polyimide substrate bends significantly in LN$_2$ at −196° C. due to thermal stresses.

Even at room temperature, there is significant residual stress and bow, as shown in FIG. 8. The thickness of the polyimide is optimized to deliver the maximum bending stresses. The highest stresses are obtained in the bending mode. The thin layer on Kapton rolls down to 0.75-inch diameter in $LN_2$ without cracking, as shown in FIGS. 9 and 10. As the temperature drops, the polyimide shrinks at a higher rate than the GaAs. This causes the composite structure to bend and roll as a tube with the polyimide on the inside. The thin solar cell flattens when placed on a hot plate at 100° C.

The success of the epitaxial lift-off by crack propagation hinges on a delicate balance between the initial scratching and the loading by the polyimide which depends on the polyimide-to-GaAs thickness ratio and the crystallographic orientation of the wafer. GaAs (110) cleaves smoother and more uniformly than (100). The extent of the lateral crack propagation also depends on the thickness ratio. Thicker polyimide causes the crack to propagate farther but lifts-off a thicker layer and may break the wafer. It is desired to minimize the thickness of polyimide to increase the specific power ratio for space applications. The right combination of stresses is necessary to guide the crack near the interface. However, thermal stresses cause significant bow as illustrated in FIG. 2a. It is desired to minimize the effect of stresses on the performance of the solar cell.

Precise control over crack propagation is necessary to lift-off layers with uniform thickness and smooth surface. Atomically smooth cleaved surfaces were obtained by controlling the crack propagation. The polyimide applies pure bending moment on the GaAs wafer which is the optimal mode of opening a crack in tension (Mode I) because it avoids the shearing stresses (Mode III) which cause deviation in the path and uncontrollable crack propagation [8,9]. If these requirements are not met then the crack can bifurcate and branch out and cause secondary cracks to propagate at different angles along different paths. To maximize yield in production a fundamental understanding of fracture mechanics at the nano-scale is essential. For industrial applications this process must be controlled. The focus of the research is to better understand the stress mechanisms that lead to rupture and how to control the path of the crack. The challenges are controlling the crack propagation depth near the epi/wafer interface and preventing the substrate from shattering. Femtosecond laser ablation produces less severe stresses and a gentler lift-off than cooling in liquid nitrogen. Both concepts lead to recovery and reuse of the growth substrate.

SUMMARY OF THE INVENTION

A sacrificial layer embedded between the GaAs wafer and the multi junction solar cell is damaged gently with a laser at the appropriate wavelength and fluence to break the bonds at a certain plane without causing excessive heat or stresses to avoid damaging the substrate or the solar cell. The sacrificial layer must be single crystal and grown epitaxially. It is preferred to use a layer that is lattice-matched to the substrate in order to minimize the defects and avoid dislocations in the subsequently grown triple junction solar cell. It must have a bandgap lower than that of GaAs so that the laser radiation is not absorbed in the substrate.

BRIEF DESCRIPTION OF THE DRAWINGS

The accompanying drawings are not intended to be drawn to scale. In the drawings:

FIG. 23a Direct two photon absorption in Ge [18];

FIG. 23b Indirect two photon absorption in Ge [18];

FIG. 26 4" GaAs wafer diced yields two cells for space applications. Several cells are integrated on common blanket polyimide sheet. Photo courtesy of Sharp Corporation;

DETAILED DESCRIPTION OF THE INVENTION

Figure 1:
FIG. 1 Thin IMM3J solar cell on polyimide substrate 50 μm thick.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing", "involving", "triple-junction" or "multi-junction" and variations thereof herein, is meant to encompass the items listed thereafter and equivalents thereof as well as additional items.

Laser Epitaxial Lift-off (LELO)

Figures 2A, 2B:
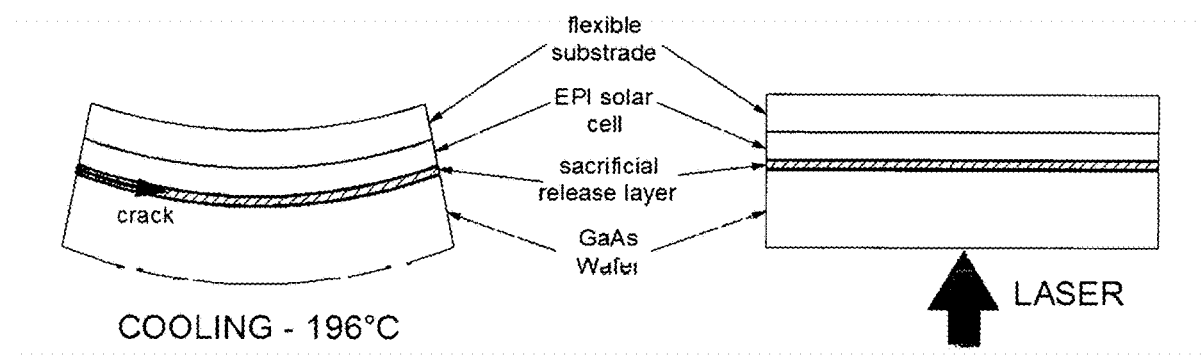
FIG. 2a Concept 1 Crack propagation due to thermal stresses.
FIG. 2b Concept 2 Laser ablation of embedded epitaxial release layer.

The focus of the instant invention is on the laser concept illustrated in FIG. 2b.

Ge and GaAs are two well known semiconductor materials which have a peculiar relationship. They are almost lattice matched (Ge slightly larger) but Ge has an indirect bandgap (0.67 eV) well below that of GaAs (1.42 eV). Si is another well known semiconductor material which has a lattice constant smaller than both. They all share the same face centered cubic (FCC) diamond structure. The inclusion of 2% silicon in germanium pulls it slightly to the left and aligns it perfectly with GaAs. Therefore, the sacrificial layer is $Si_{0.02}Ge_{0.98}$. InGaAs is another potential material. The inclusion of Indium in GaAs increases the lattice unit dimension, with the result that the InGaAs layer will be strained. A pseudomorphic InGaAs layer up to a few nanometers thick can be grown and will maintain its strain, but InGaAs has a bandgap and a melting point (1150° C.) higher than Ge (937° C.), and therefore presents no advantage over Ge. Furthermore, a strained layer this thin is not effective at guiding a crack. By contrast a SiGe layer can be grown to any thickness because it is lattice-matched to the GaAs substrate.

The embedded SiGe layer is ablated using a laser in the NIR. This exploits the difference in absorption between Ge and GaAs due to the fact that they have substantially different bandgaps. Therefore, the choice of wavelength is of paramount importance.

A laser with the right combination of threshold of energy and pulse duration is used to damage, i.e. photo-chemically break the bonds and weaken the SiGe layer so that the epi-layer can be separated from the wafer gently without causing excessive stress or bow, by pulling off the Kapton with either mechanical force or vacuum. This is true epitaxial lift-off because it guarantees that the separation is at the interface. True ELO should not depend on the wafer-to-polyimide thickness ratio or the orientation of the wafer. Any film can be transferred from any semiconductor wafer to a flexible substrate regardless of the thickness or orientation if a suitable wavelength is used that is not absorbed in the wafer but absorbed in the sacrificial layer. This relies on the physics of absorption rather than thermal stresses due to CTE mismatch. Nevertheless, the heat of ablation may cause a crack to propagate in the Ge layer [14]. Most importantly, it relaxes the requirement on the optical focusing system. The lift-off can therefore be done using relatively inexpensive optical components and micro-positioning stages and mildly focused or even expanded laser beams. The embedded sacrificial layer does not even have to be within the focal zone.

Epitaxial growth of III-V compounds offers the possibility of separating the epi-layer from the growth wafer by embedding a lattice matched sacrificial layer with lower bandgap at the interface which absorbs IR radiation but which is transmitted by the substrate and the active solar cell layers. Laser ablation is usually done in the UV because most materials absorb in the UV and UV radiation is very intense. However, Ge and GaAs have been ablated with femtosecond pulses at 800 nm [15,16] and in the IR up to 5 μm [17,18,19] and with nanosecond pulses at 1.064 μm [20] separately at an exposed surface. But the buried interface between Ge and GaAs has not been damaged or ablated before.

Figure 11:
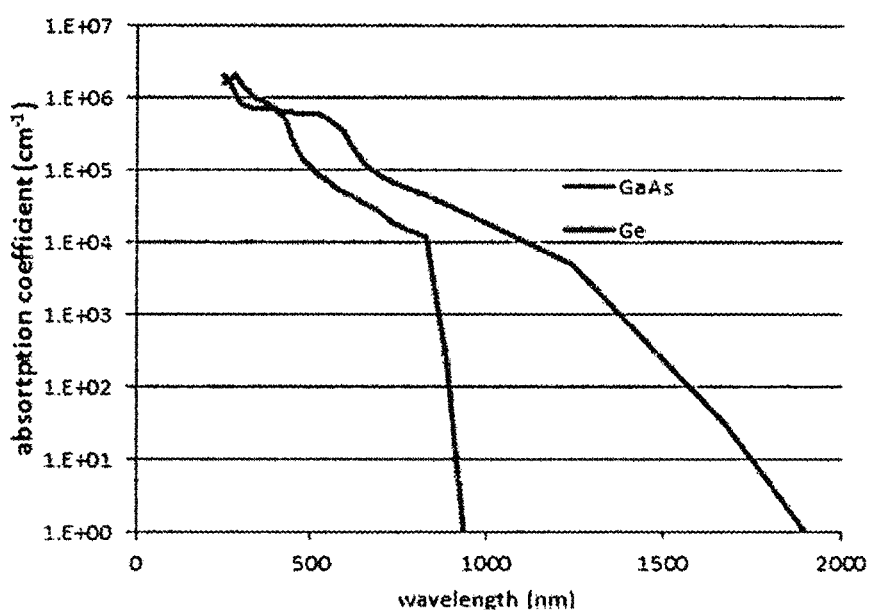
FIG. 11 Absorption coefficients of Ge and GaAs.

FIG. 11 shows the absorption spectra of Ge and GaAs up to 2 μm. The absorption in GaAs drops precipitously just before 1 μm. At that wavelength there are four orders of magnitude difference between the absorption coefficients of Ge and GaAs. Thus, it should be easy task, in principle, to choose a wavelength just above 1 μm, such as 1.064 μm Nd:YAG, which is a common industrial laser with pulse widths between 20 and 200 nanoseconds should do the job, but it doesn't. It is not so simple because this graph is for single photon absorption. The absorption in Ge and GaAs is actually due to two or even three photons.

Figure 12:
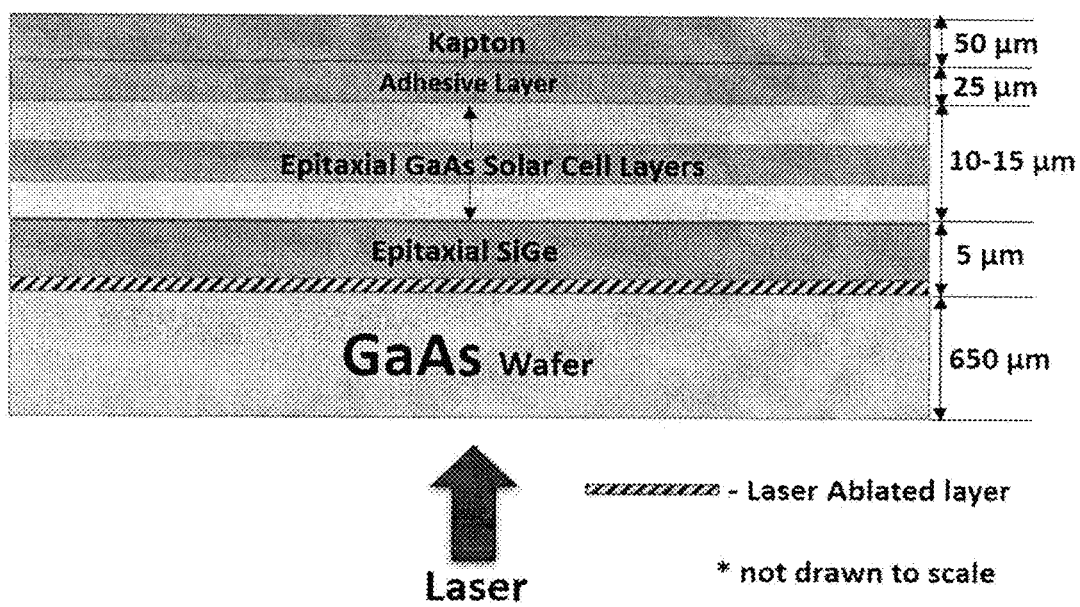
FIG. 12 Structure consisting of GaAs wafer, SiGe sacrificial layer, triple junction solar cell, Kapton/adhesive.

FIG. 12 shows the solar cell structure bonded to Kapton/adhesive. The SiGe sacrificial layer, which is predominantly made of germanium (2% Si) and referred to as the Ge layer, can have any thickness. The Ge layer can be 5 μm thick and can be as thick as 20 μm to shield the solar cell from the heat of ablation. The Kapton/adhesive is bonded to the epi-layer face down. The laser is incident from the bottom side in FIG. 12 through the GaAs wafer. The challenge is to absorb in the Ge layer without damaging the GaAs wafer. The incident light can be absorbed in GaAs as long as it does not heat the GaAs wafer above 450° C. [21]. A very thin layer about 100 nm of the Ge (blue in FIG. 12) adjacent the GaAs is ablated.

Figure 13:
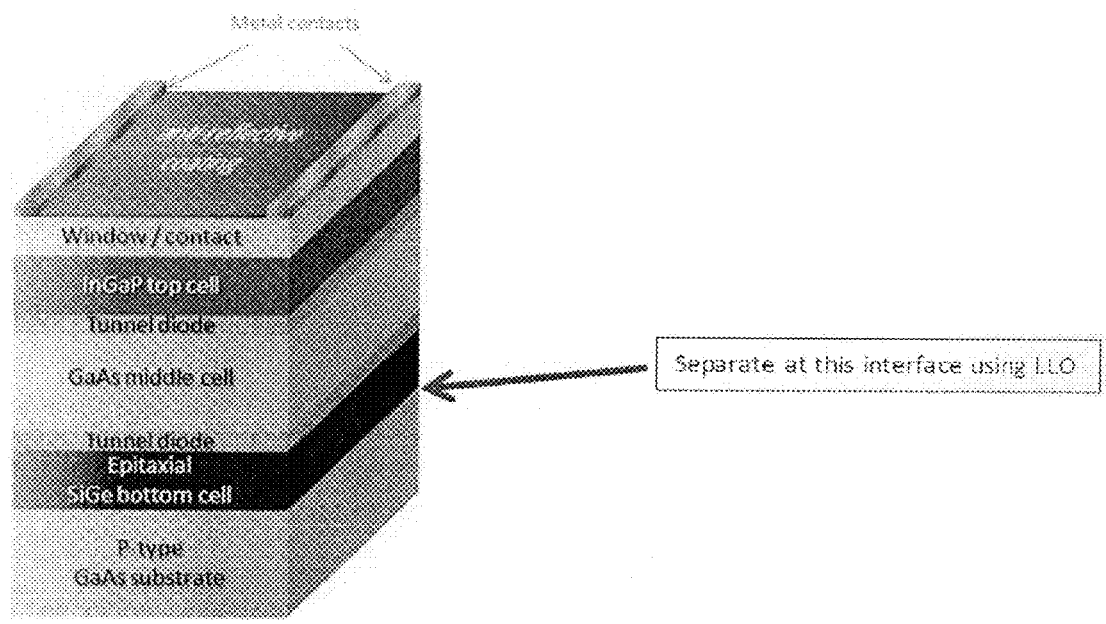
FIG. 13 Non-inverted triple junction solar cell where the Si/Ge layer acts as bottom cell.
Figure 14:
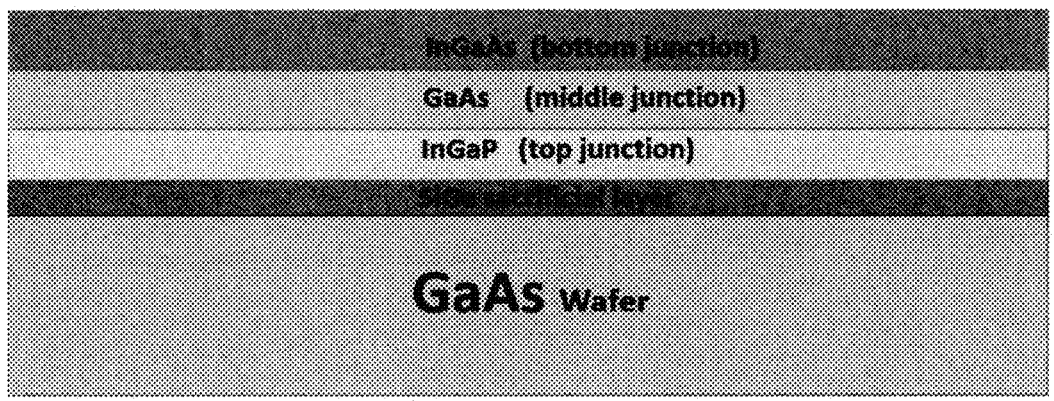
FIG. 14 Inverted metamorphic triple junction (IMM3J) solar cell consisting of InGaP top junction grown first on SiGe sacrificial layer, GaAs middle junction, and InGaAs bottom junction (lattice mismatched) grown last.
Figure 15:
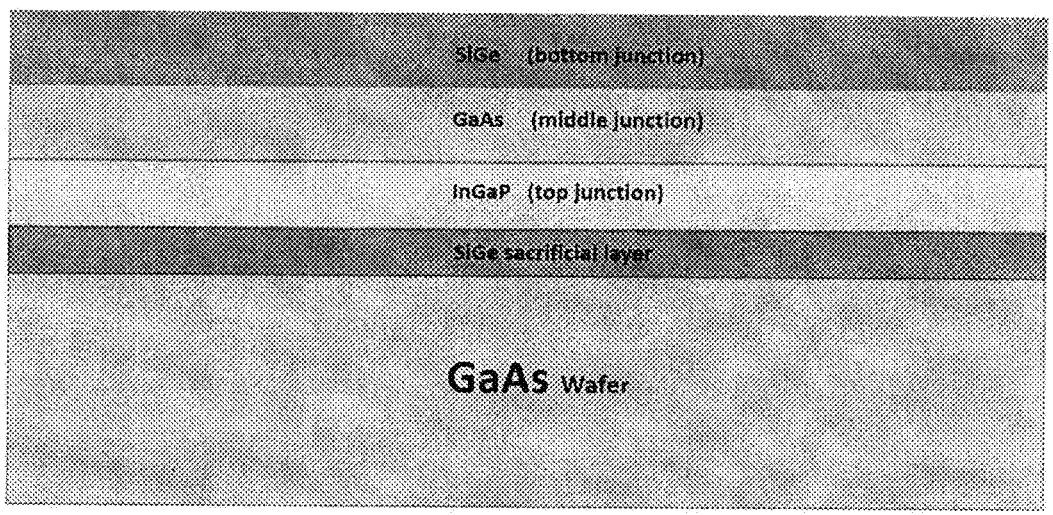
FIG. 15 Lattice matched inverted triple junction (LMI3J) solar cell consisting of InGaP top junction grown first on SiGe sacrificial layer, GaAs middle junction, and SiGe bottom junction grown last.

A non-inverted triple junction solar cell structure, where the SiGe acts as the bottom junction is shown in FIG. 13. By contrast, in an inverted IMM3J structure the InGaP top junction is grown first on the SiGe layer and the middle GaAs junction next, i.e. the order of growth of GaAs and InGaP is reversed, as shown in FIG. 14. A metamorphic (lattice mismatched) InGaAs bottom junction is grown last. In an inverted cell the SiGe layer does not play any role in the cell, other than a sacrificial layer, which gets ablated away. The red arrow in FIG. 13 points to the plane of separation. After separation, the remaining SiGe on the solar cell, which is now on Kapton, is etched away. Alternatively, a second SiGe layer is grown last on the GaAs layer, which provides the bottom junction, as shown in FIG. 15. This yields an all lattice-matched inverted (LMI) solar cell.

Figure 16:
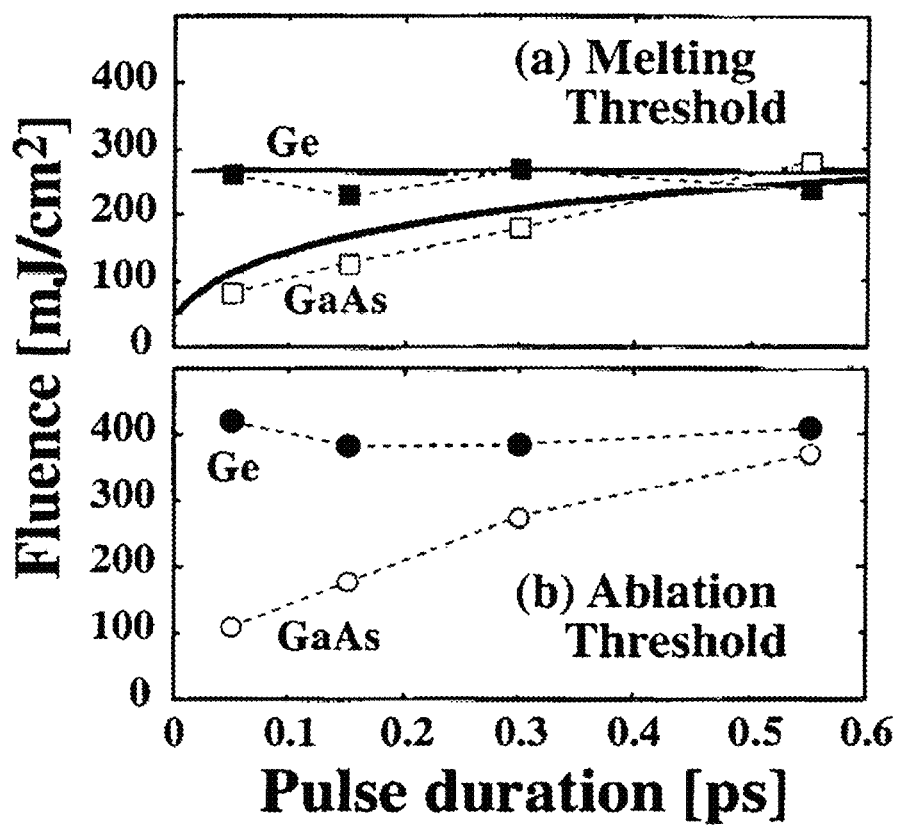
FIG. 16 Single-shot melting and ablation thresholds of Ge and GaAs for femtosecond pulses at 800 nm [15]

The main objective is the ablation of an embedded layer. The problem is that the laser has to cross the GaAs wafer without damaging it. And the absorption should not be the result of precise focusing on the Ge. The focus can be vertically anywhere (outside the GaAs wafer). It is only the Ge that should absorb, not the GaAs. This is achieved through proper choice of the wavelength, pulse duration and laser power. In fact it is desired to spread the laser over an entire 4" wafer, as long as the laser has enough power to do the ablation. The Ge evaporates when ablated and needs room to escape. It would be more advantageous to ablate the entire wafer in one shot, if possible, to provide room for the Ge to escape. Materials melt before evaporating. Ge melts at 937° C. whereas GaAs melts at 1240° C. So it is expected that Ge would melt first. Yet GaAs has a lower threshold for melting and ablation than Ge when illuminated with 100-500 femtosecond pulses at 800 nm [15], as shown in FIG. 16, which suggests that there are other mechanisms of absorption.

Figure 17A:
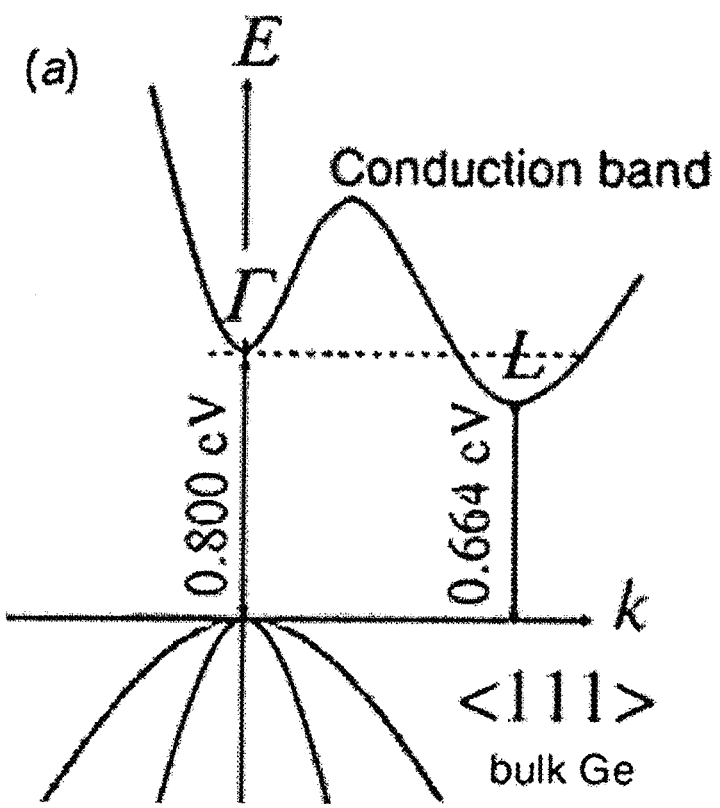
FIG. 17a Direct and indirect bandgaps in Ge.
Figure 17B:
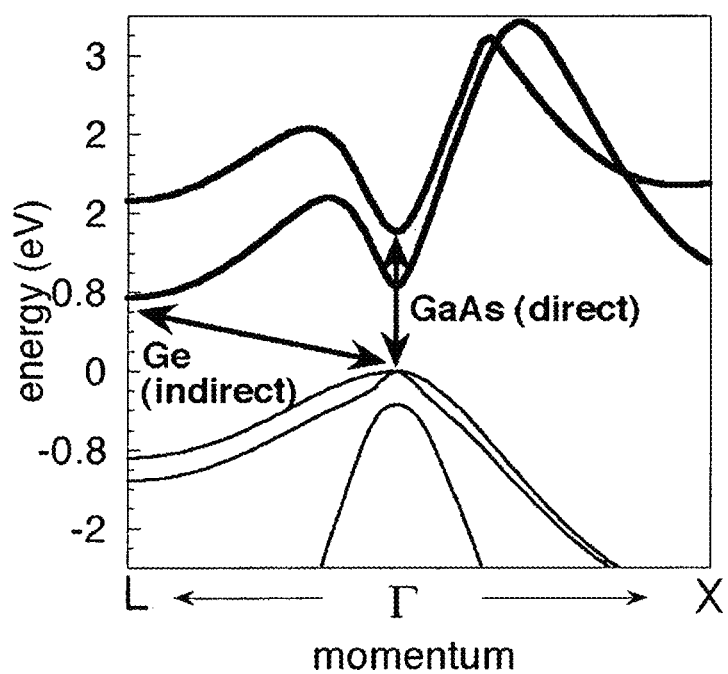
FIG. 17b Direct and indirect bandgaps in Ge and GaAs.

The threshold of ablation of Ge is about 400 mJ/cm$^2$. It should be increased by 56.25% to account for the reflection at the GaAs/air interface (n=4). A good estimate of the fluence needed for ablation is 500 mJ/cm$^2$. Actually the material may not need to be melted or ablated. It needs only to be weakened. Even though GaAs has a wider bandgap of 1.42 eV (0.87 μm), but it actually has a lower threshold than Ge. This shows that it is a better absorber. It must be due to the direct bandgap. However, Ge too has a direct bandgap at 0.8 eV (1.55 μm) which absorbs even more than the indirect gap at 0.664 eV corresponding to a wavelength of 1.867 μm for single photon absorption. Both have tendencies to absorb non-linearly in their direct bandgaps. Thus, one problem to be faced is that GaAs is a better absorber and has a lower threshold than Ge. The E-k diagrams of Ge and GaAs are shown in FIGS. 17a and 17b.

Even though GaAs has a melting temperature of 1240° C. but it cannot take more than 450° C. [21]. Processing GaAs at temperatures above 450° C. requires As-rich atmosphere, which is toxic. Furthermore, the temperature in the entire structure should be limited to 200° C. due to the organic adhesive and Kapton. Impurities in the GaAs accelerate the absorption. The lattice and CTE of Ge and GaAs are well matched, however, raising the temperature beyond 200° C. would create stresses. The structure cannot be heated with a steady source like a CW laser. Even nanosecond pulses are too long and lead to heating of the entire structure beyond the damage temperature of GaAs.

The Ge reaches a temperature well above 937° C. It melts, evaporates and may even turn into plasma. The heating must be localized to the Ge layer. The heat affected zone (HAZ) should not spread beyond the optical absorption depth. The goal is to break the covalent bonds in Ge without raising the temperature in GaAs and the surrounding materials beyond 200° C. Ideally, the surface of GaAs remains intact. However, even though the GaAs wafer may be transmissive to the laser, the plume from the confined ablated Ge layer may create an explosive pressure zone leading to the removal of some GaAs as well.

Ultra-short Pulse Laser Ablation

Ablation is inherently a thermal process at the nano-scale. The material turns to vapor as it absorbs the intense pulse energy. The absorption depth is on the order of 100 nm. The issue is whether the heat has enough time to diffuse beyond the absorption zone before the pulse has ended. The diffusion length varies as the square-root of the thermal diffusivity times pulse duration. For nano-second pulses it is on the order of 1 μm; for femtosecond pulses 1 nm. Damage to the structure occurs when the heat spreads outside of the ablation zone. In this case the GaAs should remain intact. Thus, the heat must remain localized inside the Ge. In order to control the ablation it is important to contain the heat inside the absorption zone.

Figure 18A:
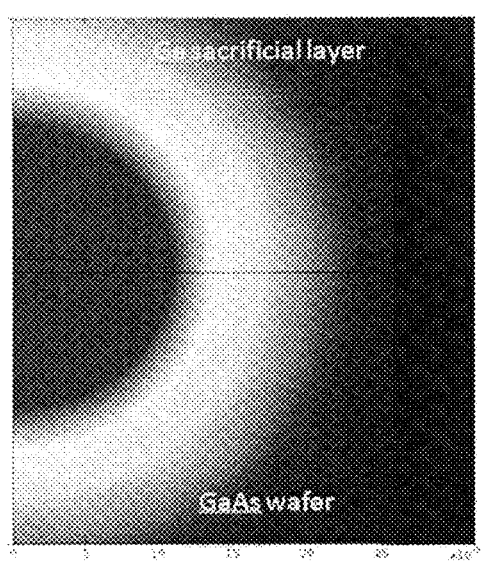
FIG. 18a Temperature profile for 38 ns pulse.
Figure 18B:
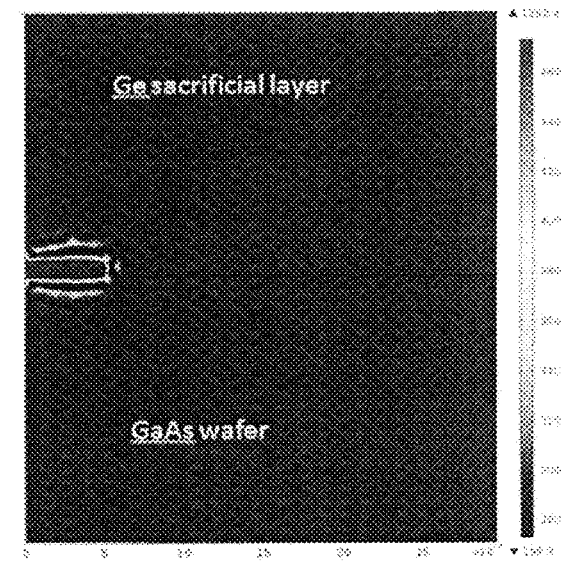
FIG. 18b Temperature profile for 38 fs pulse.

FIGS. 18a and 18b show a simulation of the temperature profile at the Ge/GaAs interface for two pulse widths of 38 ns and 38 fs, respectively, using COMSOL for a Ge temperature of 937° C. corresponding to the melting point. The rectangle at the center left has dimensions of 500×100 nm and represents the absorption zone. The color coded scale to the right shows the temperature from ambient 293 K (blue) to 473 K=200° C. (red). It is seen that for nanosec pulses about 1 μm radius inside the GaAs wafer is above 200° C. In fact the temperature reaches above 900° C., whereas for femtosecond pulses the temperature across most of the wafer remains cool near room temperature well below 200° C. The heat is confined to the 100 nm absorption zone.

There are hundreds, possibly thousands of papers on the subject of laser ablation and specifically ultra-short pulse laser ablation. In almost every instance the authors state that the fundamental mechanism of ablation is still not understood [22,23]. However, it is generally agreed that there are two regimes: the long pulse regime which extends from nanosecond all the way to CW, and the ultra-short pulse regime, below picosecond down to 100 femtoseconds. For this reason, ablation is often described as being either thermal (for long pulses) or non-thermal (for ultra-short pulses) on a micro-scale. The heat is confined to the nano-scale. It is also known as "cold ablation". The goal of the instant invention is to engineer a way for the radiation to be absorbed in Ge after passing through GaAs, by choosing the appropriate wavelength, power level and pulse width.

Incoming photons are absorbed by the free electrons leading to the formation of a gas of hot carriers which transfer their energy to the ions through the emission of phonons. Ions and electrons eventually reach equilibrium on a timescale $10^{-12}$-$10^{-11}$ s (1-10 picoseconds). This timescale is crucially important as it sets the boundary between strictly thermal and non-thermal regimes, which distinguishes "long" from "short" pulses. A nanosecond is a very long time by electronic scales. If the pulse width is much larger than the diffusion time, equilibrium prevails and phase changes can be considered as slow thermal processes involving quasi-equilibrium thermodynamics. In contrast, for ultra-short pulses (<$10^{-12}$ s), the material is driven into a highly non-equilibrium state [22]. In this case, each pulse acts as if it were alone, independent of the other pulses. By contrast, in the long pulse regime the material reaches a steady state temperature under the cumulative bombardment of many (tens of thousands) of pulses and the surrounding material is heated beyond the melting point. For this reason, a femtosecond laser is used to ablate the embedded Ge layer because it produces a cleaner colder cut.

Heat diffusion reduces the efficiency of the micromachining process because it sucks energy away from the work spot, energy that would otherwise be used for removing material. Heat diffusion reduces the working temperature at the focal spot, pinning it not much higher than the melting temperature. It creates shock waves and microcracks in the surrounding material. The HAZ is about 30 μm wide. It causes damage to adjacent structures, delamination, and poor shot-to-shot reproducibility. The melted material resolidifies and redeposits and contaminates the surface. The debris is extremely hot and very difficult to remove. It is therefore desirable to reduce or eliminate heat diffusion.

Ultrafast pulses are extremely short and powerful. The laser energy has nowhere to go or more precisely does not have the time to move away. The energy piles up in the absorption zone, whose temperature rises instantly past the melting, boiling and evaporation points. So much energy is deposited in such a short time that the material is forced into a state of plasma. Femtosecond lasers deliver a huge amount of peak power up to a hundred GigaWatt. The power density reaches several TeraWatt/cm$^2$ on the work surface. No material can withstand these power densities. Even air molecules breakdown. There is no melt phase. The energy is absorbed by the electrons much faster than it is transferred to the lattice. Heat diffusion is virtually eliminated [25]. There is no collateral damage, no melt zone, no micro-cracks, no shock waves, no recast layer, and no damage to adjacent structures. The plasma expands away from the surface as a highly energetic plume taking all the heat away with it. Consequently very little heat is left behind to damage the material. This yields high quality machining, which is very desirable.

Figure 19:
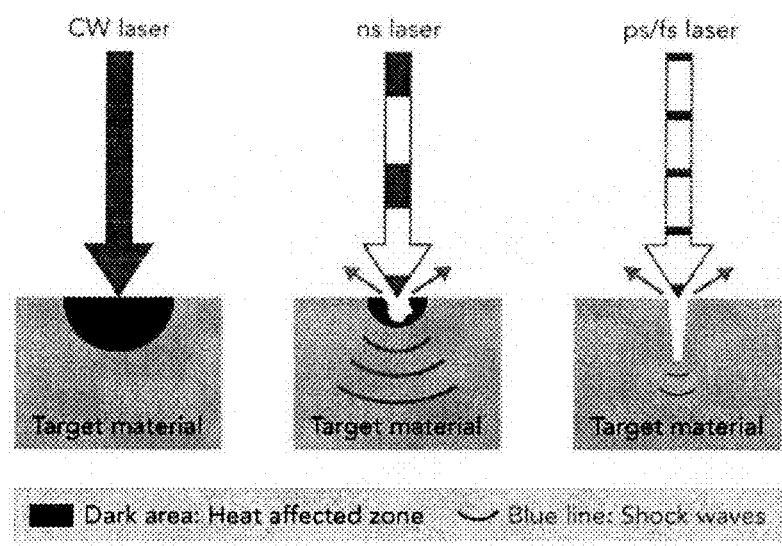
FIG. 19 Heat affected zone for CW, nanosecond and femtosecond pulsed lasers, courtesy of Raydiance, Inc.

FIG. 19 illustrates schematically the difference between long and short pulse-material interactions for three different types of lasers: CW, nanosecond and femtosecond [26]. The black area indicates the size of the heat-affected zone and the blue lines show the shock waves created by the laser pulses. The CW laser (far left) removes material primarily by melting, which creates a large HAZ. The nano-second laser (center) creates a smaller HAZ, while the femtosecond laser (right) removes material by plasma plume. No HAZ is created.

Ultra-fast laser pulses have sufficient peak power and generate high enough electric fields to break the molecular bonds of the material, transforming it directly from a solid to a gas. These pulses are so fast that the energy doesn't have a chance to do more than break the material's molecular bonds. This is known as photochemical or photolytic decomposition, which usually happens in the UV. However, it can also happen in the NIR through two-photon absorption [28]. During purely photochemical processing, the temperature of the system remains relatively unchanged. It has been shown that crystalline Ge and GaAs undergo non-thermal ablation in the sub-picosecond time scale [16]. The damage is done with one pulse.

The energy is initially stored in the electronic system. If the intensity of the laser is high enough to overcome the binding energy of the outer valence electrons, then the electrons are stripped from the lattice by multi-photon absorption [27], which leads to avalanche ionization [28]. The ablation depends on the presence of free electrons in the beam path. Semiconductors have plenty of electrons, except that the vast majority of them are bound. Very high energetic radiation, such as UV or ultra-short pulse NIR lasers have enough power to knock some electrons free. The free electrons collide with other bound electrons and create an avalanche. This leaves the atoms near the surface ionized, all positively charged. The excited electrons escape from the bulk material and form a strong electric field that pulls out the ions within the impacted area. The Coulombic repulsion of the positive ions breaks the chemical bonds that previously held the solid together. The ions break apart in a cloud of rapidly expanding plasma. This process is known as Coulomb explosion, which is considered "gentle ablation" because it happens just above the threshold fluence of ablation and leaves behind an atomically smooth surface [28]. The release of fast ions with a narrow velocity distribution indicates a non-thermal process.

A power density of $5 \times 10^{12}$ W/cm$^2$ which is readily attainable with commercial femtosecond lasers, about 100 fs long pulses, when focused to an area 100 µm×100 µm=$10^4$ cm$^2$, is close to the threshold of laser-induced air breakdown of $10^{13}$ W/cm$^2$ at which plasma is generated. This yields an energy density of 500 mJ/cm$^2$, which is near the threshold of ablation of Ge. Therefore, the power available from commercial lasers yields gentle ablation because it is near the threshold of ablation. At these intensities non-linear absorption becomes dominant and causes multi-photon ionization.

Ultrafast lasers are used to machine inside the bulk of transparent materials [10]. Very localized non-linear absorption occurs only at the peak of the focused Gaussian beam where the intensity exceeds the threshold. With longer pulse lasers the sample damages before the intensity reaches the threshold for non-linear absorption. For this reason, femtosecond lasers are used in selective machining of multi-layer devices, and would be useful for weakening the embedded Ge layer in the instant invention.

There is not much published data on the threshold of ablation of Ge in the NIR for femtosecond pulses, albeit at 800 nm. FIG. 16, [15] shows that the threshold of Ge remains constant for sub-picosecond pulses at about 400 mJ/cm$^2$, whereas that of GaAs decreases to 150 mJ/cm$^2$ at a pulse width of 100 fs. Furthermore, it has been reported in [29] that the threshold continuously decreases with a gradual transition from the long pulse, thermally dominated regime to the ultrashort pulse ablative regime dominated by impact and multiphoton ionization, and plasma formation. The strong non-linear dependence of multiphoton rates on intensity causes the threshold to become increasingly sharply defined for shorter pulse durations. The threshold of ablation of Ge in the NIR is to be measured.

EXAMPLE 1

Ablation of Ge and GaAs with Nanosecond Laser at 1.064 µm

Figure 20A:
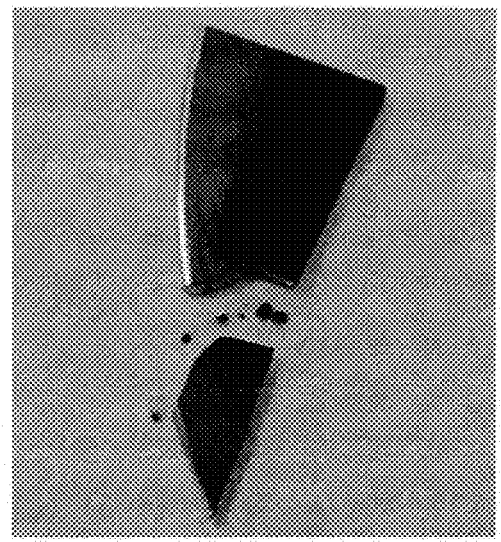
FIG. 20a GaAs wafer piece broken by ns laser at 1.064 μm.
Figure 20B:
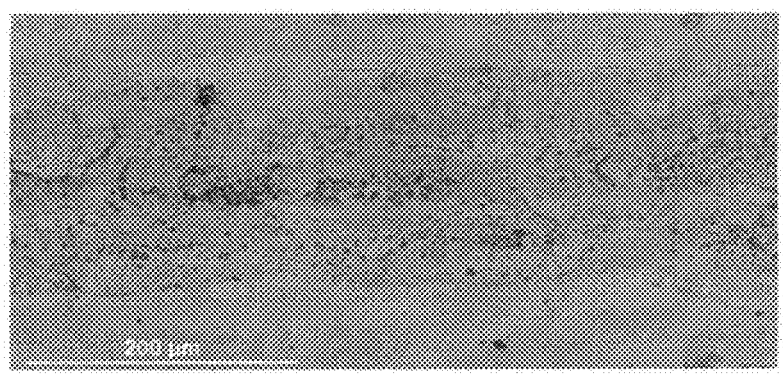
FIG. 20b Ge wafer piece melted with ns laser at 1.064 μm shows cracks.
Figure 20C:
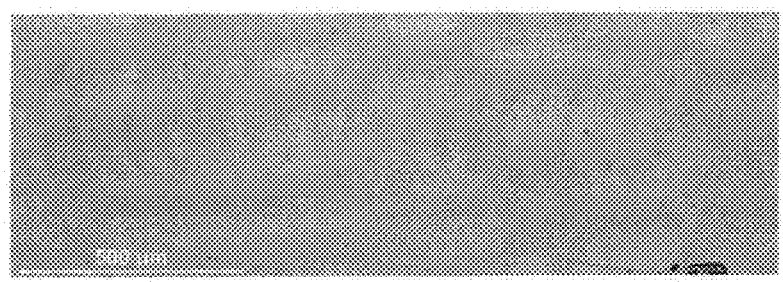
FIG. 20c Ge wafer piece melted with ns laser at 1.064 μm.

A Q-switched Nd:YAG laser with pulse width 120-250 ns, peak power 5-8 kW, energy 1-1.25 mJ per pulse, pulse repetition rate 30-50 kHz, average power 38-50 Watts, with a beam diameter of 1.2 mm was used to damage Ge and GaAs wafer pieces. The energy density on the work piece was adjusted by varying the scanning speed between 15 and 300 cm/sec and defocusing the laser beam. A bare Ge wafer piece was first melted. The results are shown in FIG. 20. At high fluence near focus (FIG. 20b) the surface became rough and cracks developed. At lower fluence (FIG. 20c) the defocused laser left soft marks on the Ge, which indicates that the surface was damaged. The transmission through the double-side polished GaAs wafer was measured about 50%. However, when the laser spot was left in the same position for about 15-20 seconds it burned a hole in the GaAs wafer (FIG. 20a). Ge has a higher single-photon absorption than GaAs at this wavelength (1.064 µm), as expected. But the problem is that GaAs absorbs due to two-photon absorption. For this reason a femtosecond laser would be beneficial. It is also important to use high quality GaAs wafers that are free of defects. The primary goal of the instant invention is the absorption in Ge, but since the light must pass through GaAs first, then it is necessary to study the absorption in GaAs in order to avoid it.

Choice of Wavelength

Figure 21:
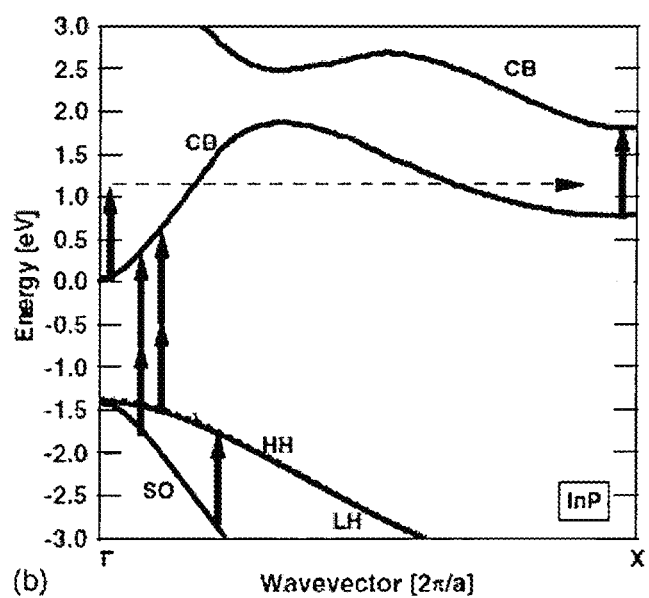
FIG. 21 Band gap of GaAs, one photon and two-photon Absorptions are shown by single and double vertical arrows [17]
Figure 22:
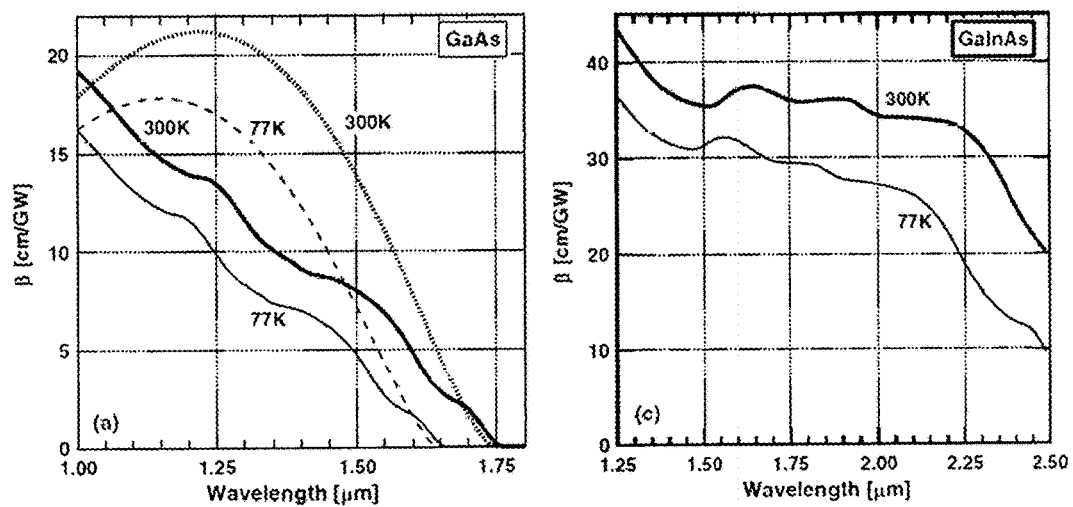
FIG. 22 Two-Photon Absorption coefficients at 300 K and 77 K for GaAs and $In_{0.36}Ga_{0.64}As$ [17]

Two-photon absorption in GaAs has been studied at selected wavelengths between 1 and 2 µm [17]. The free-carrier absorption is predominantly due to holes. FIG. 21 shows possible intra-sub-band single photon absorptions (single arrows) and inter-band valence-to-conduction (double arrows) two-photon absorptions for wavelengths below the direct bandgap. FIG. 22 shows two-photon absorption vs wavelength for GaAs and InGaAs. Single photon absorption becomes insignificant above 1 µm, while two-photon absorption in GaAs vanishes above 1.75 µm. Thus, any wavelength above 1.75 µm will transmit through GaAs and can be used. However, it remains to be seen whether Ge would absorb at a wavelength longer than 1.75 µm. InGaAs has the two-photon absorption cross-section β between 30 and 36 cm/GW in the range 1.75 µm-2.3 µm, and drops to 20 cm/GW at 2.5 µm.

Two-photon absorption in Ge is both direct and indirect [18]. The direct transition is even stronger than the indirect transition, as shown in FIG. 23. Direct two-photon absorption peaks at 0.45 eV (2.75 µm) β=28 cm/GW, while indirect two-photon absorption peaks at 0.49 eV (2.5 µm) β=0.4 cm/GW. Thus, the direct transition is much stronger than the indirect transition. Ge is an indirect bandgap material for single photon absorption. Not only does the non-linear absorption become stronger than the linear absorption, but also the direct transition becomes stronger than the indirect transition.

Figure 24:
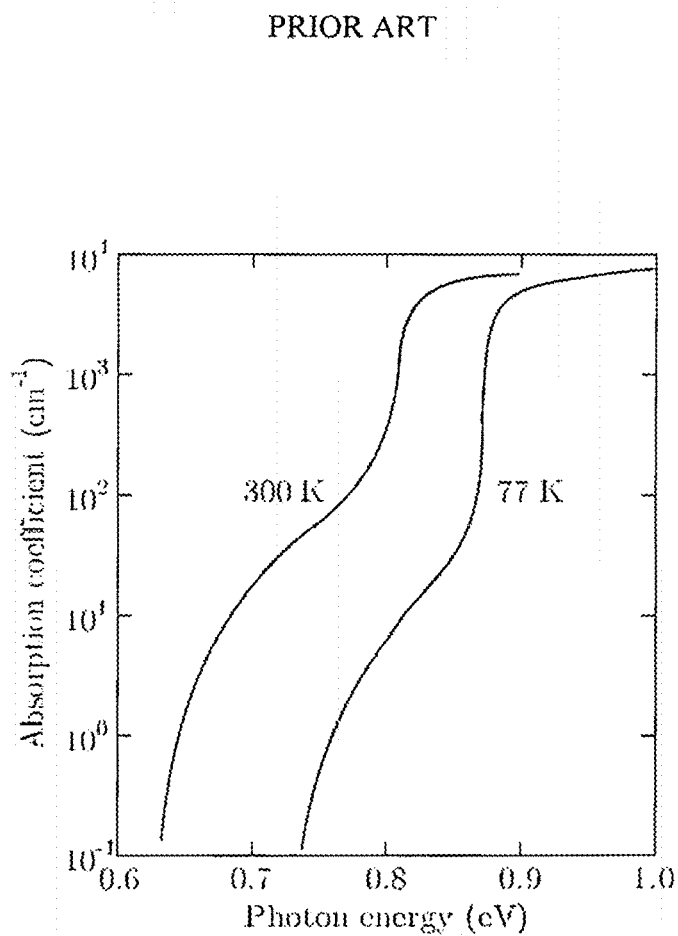
FIG. 24 Single and Two-Photon Absorptions in Ge [30]

A much stronger transition occurs in Ge in the direct bandgap (0.8 eV) than in the thermodynamic indirect band gap (0.63 eV). Both transitions can be seen as absorption edges in FIG. 24. At the threshold fluence of ablation in Ge 400 mJ/cm$^2$, the intensity I=5×10$^{12}$ W/cm$^2$ and the energy=50 µJoule/pulse in a 100 fs pulse. The two-photon absorption coefficient at 0.45 eV, βI=1×10$^5$ cm$^{-1}$, so the absorption depth=100 nm. Thus, the optimal wavelength to maximize absorption in Ge is 2.75 µm (0.45 eV), which clears GaAs. InGaAs has a slightly higher absorption coefficient in a shorter wavelength range 1.75 µm-2.3 µm. But Ge is preferred because it is lattice matched to GaAs.

EXAMPLE 2

Commercially Available Femtosecond Lasers at 2.75 µm

Figure 25:
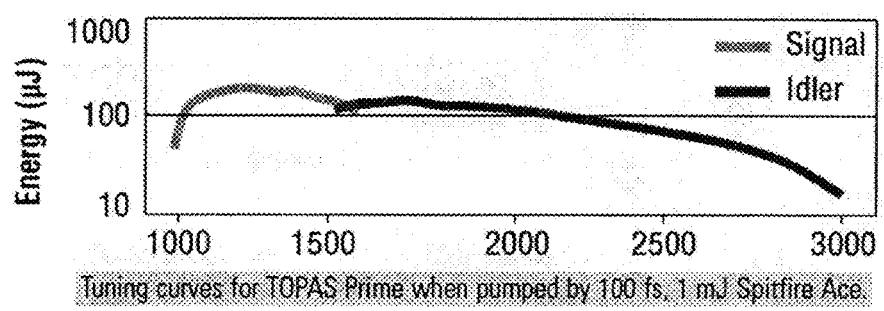
FIG. 25 Specs of TOPAS Prime® OPA when pumped by 100 fs, 1 mJ Spitfire Ace® regenerative amplifier.

Both Coherent and Spectra Physics make laser sources that are suitable for this application. The Spitfire Ace® regenerative amplifier emits up to 10 mJ/pulse @ 1 KHz which pumps the TOPAS Prime® optical parametric amplifier (OPA), which gives 50 µJoule/pulse per 1 mJ input at 2.75 µm. A typical energy output spectrum of the TOPAS Prime® laser when pumped by 100 fs, 1 mJ Spitfire Ace® regenerative amplifier, is shown in FIG. 25. Thus, the OPA is capable of emitting 500 µJoules per pulse, which allows spreading the beam to an area 300 µm×300 µm on the work surface.

Figures 3A, 3B:
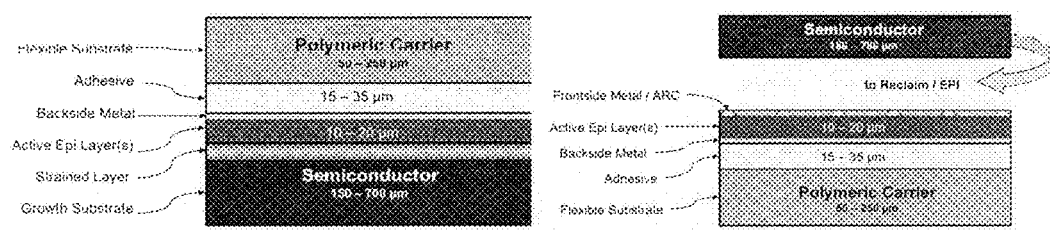
FIG. 3a Semiconductor wafer with epi-layer bonded to Kapton® permanent carrier 50 μm thick.
FIG. 3b Semiconductor wafer separated and solar cell carried by Kapton® after lift-off.
Figure 4:
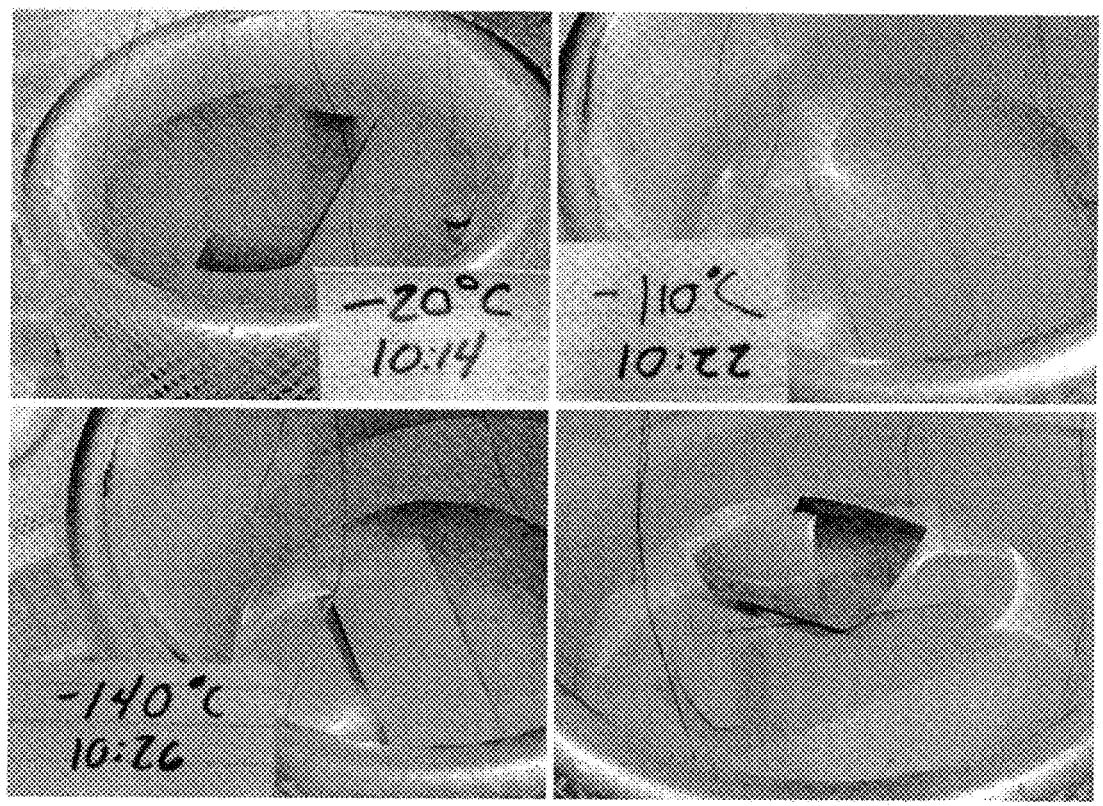
FIG. 4 Epitaxial layer lifted-off GaAs wafer piece at −140° C. on Kapton sheet (brown) 50 μm thick.
Figure 5:
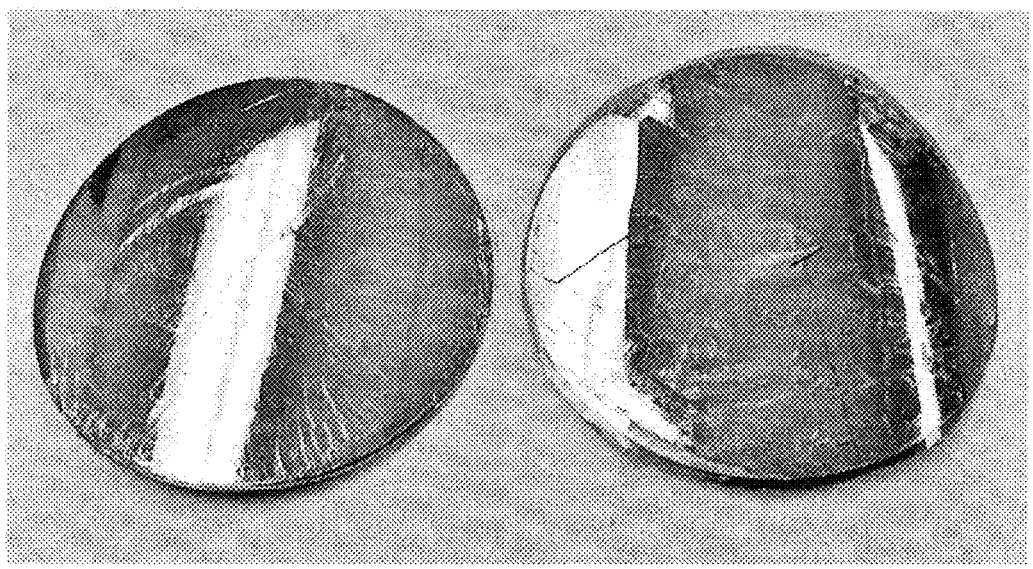
FIG. 5 GaAs (110) wafer lifted on Kapton (right), base wafer (left)
Figure 6:
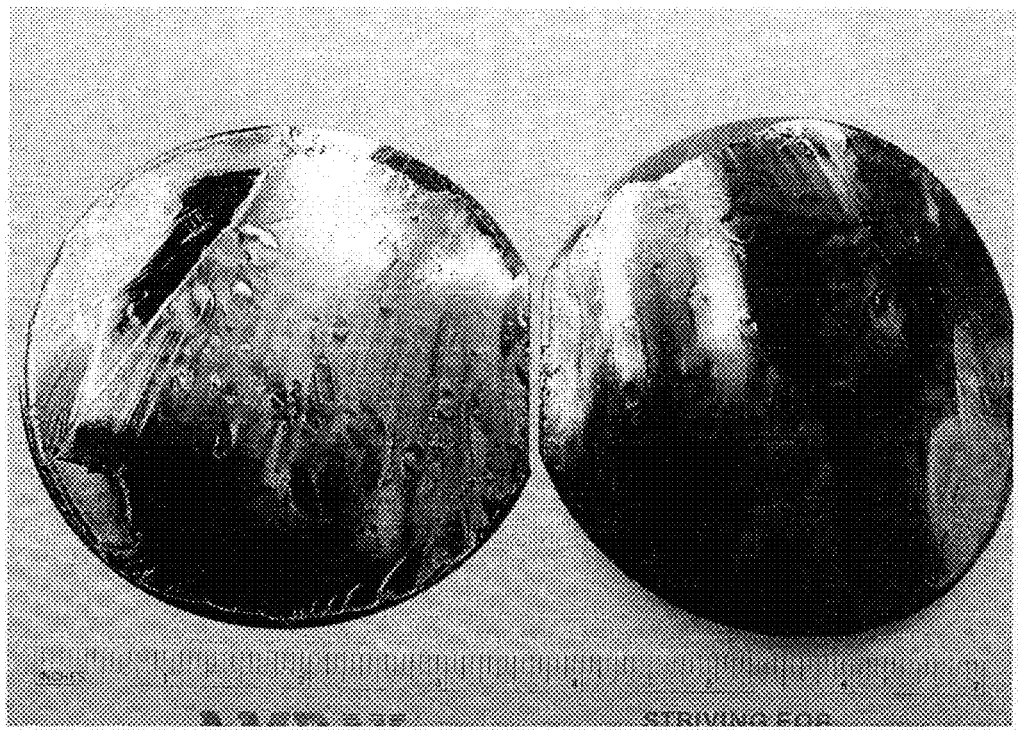
FIG. 6 GaAs (100) wafer lifted on Kapton (right), base wafer (left)
Figure 7:
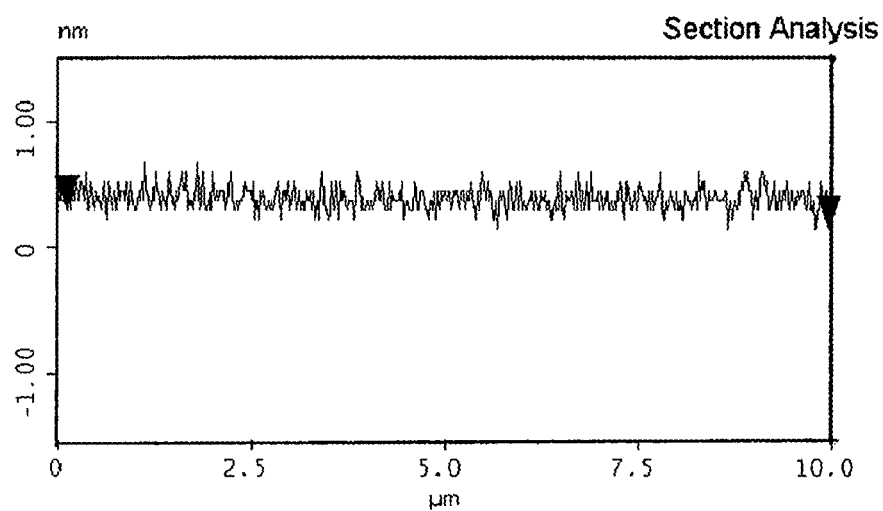
FIG. 7 AFM roughness measurements.
Figure 8:
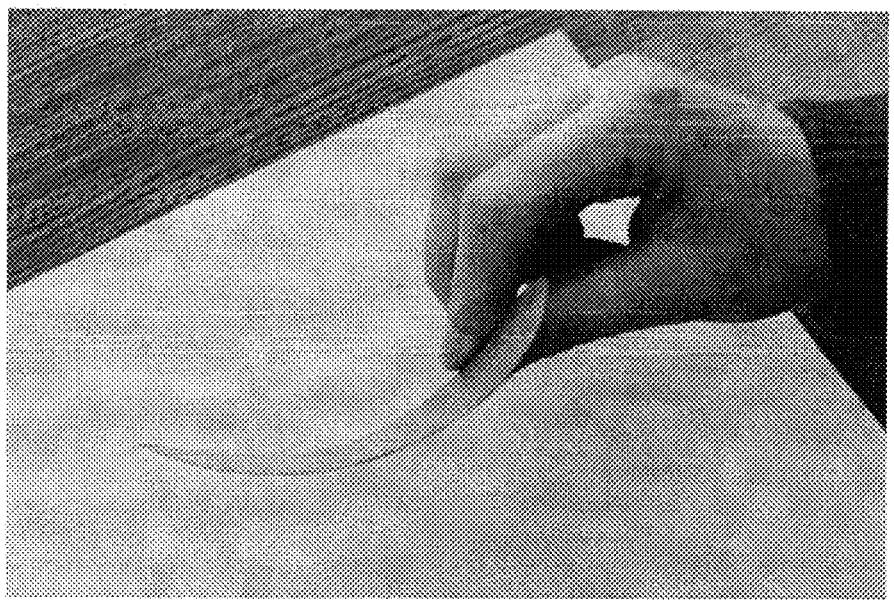
FIG. 8 GaAs wafer bonded to polyimide bowed at room temp.
Figure 9:
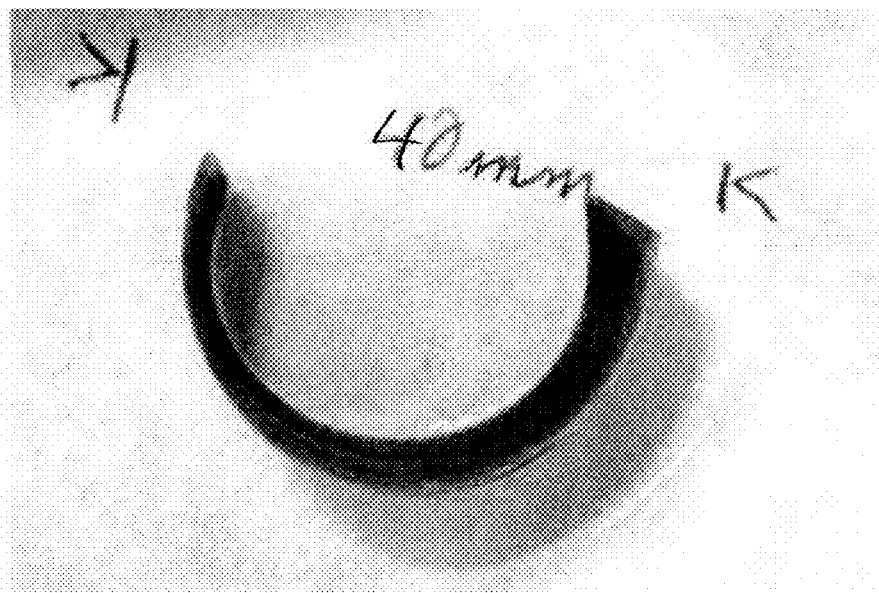
FIG. 9 GaAs epi-layer curled to 1-inch diameter.
Figure 10:
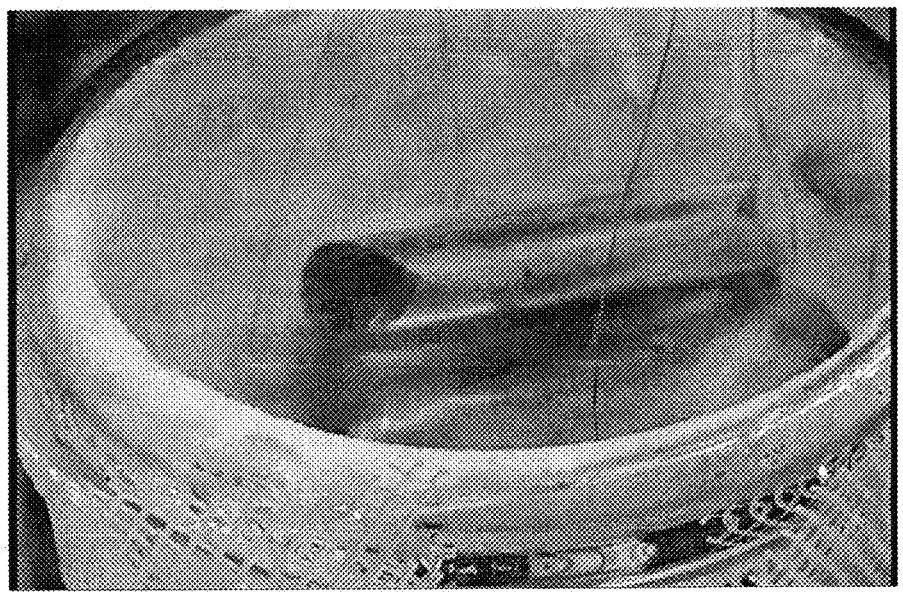
FIG. 10 GaAs epi-layer rolled to 0.75-inch diameter.

GaAs absorbs two photons up to a wavelength of 1.75 µm, and three photons up to a wavelength of 2.6 µm (see FIG. 3 on page 670 of [33]). Ge begins to absorb two photons at a wavelength below 3.1 µm and reaches a significant cross-section below 2.9 µm. Therefore, the preferred wavelength range is between 2.6 and 2.9 µm.

Figure 33:
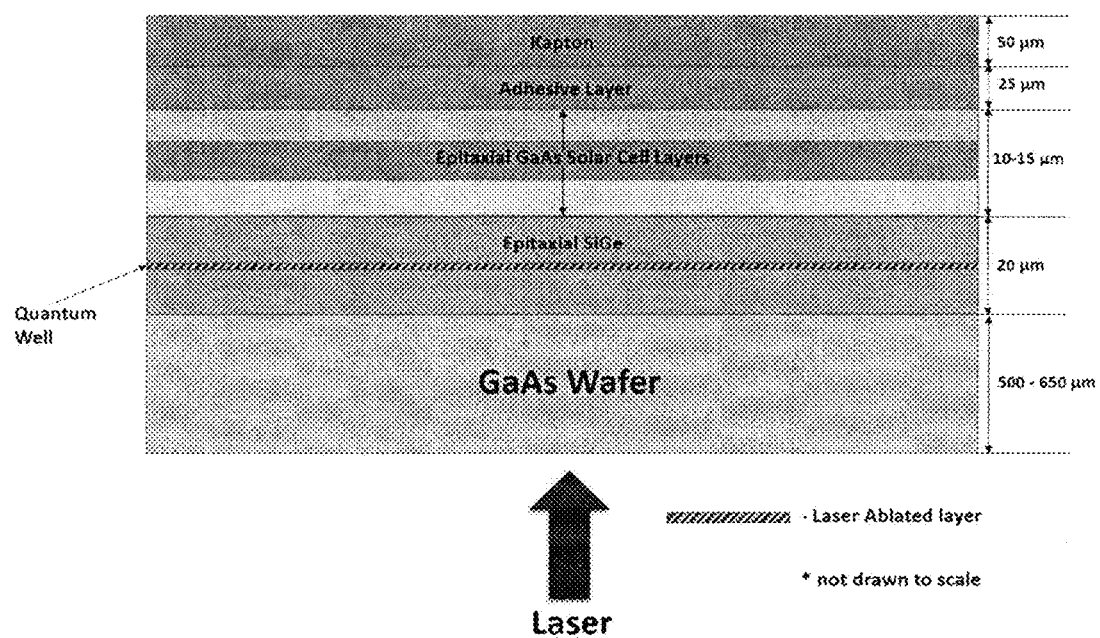
FIG. 33 Structure of solar cell with the absorption layer removed from surface of GaAs wafer.
Figure 34:
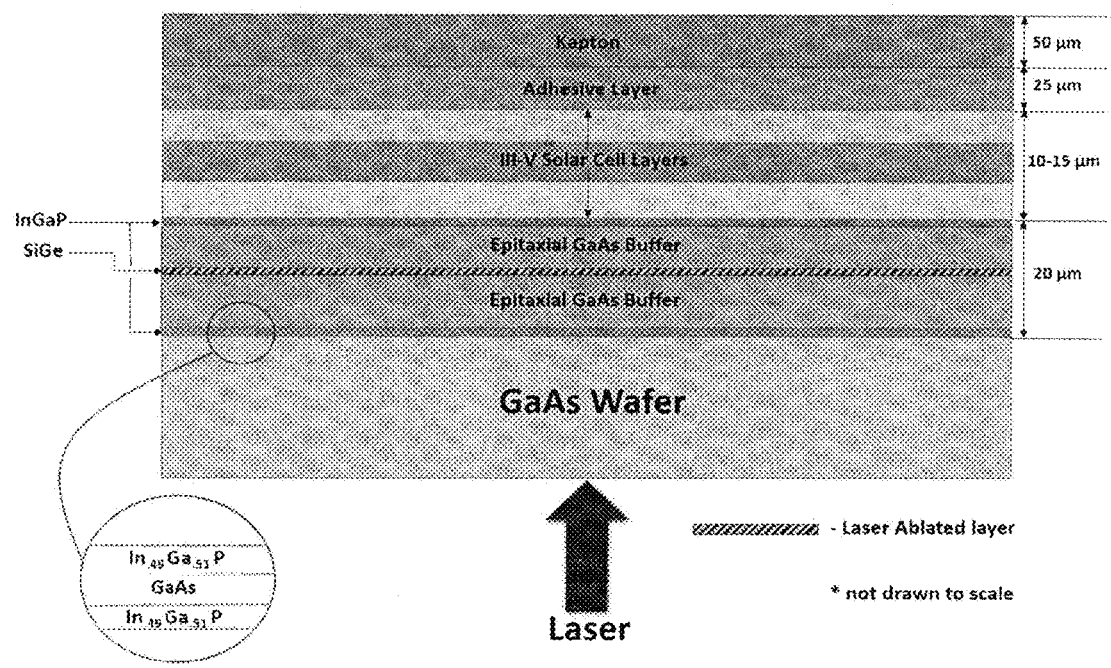
FIG. 34 Structure of solar cell with GaAs buffer layers and InGaP protection layers.
Figure 35:
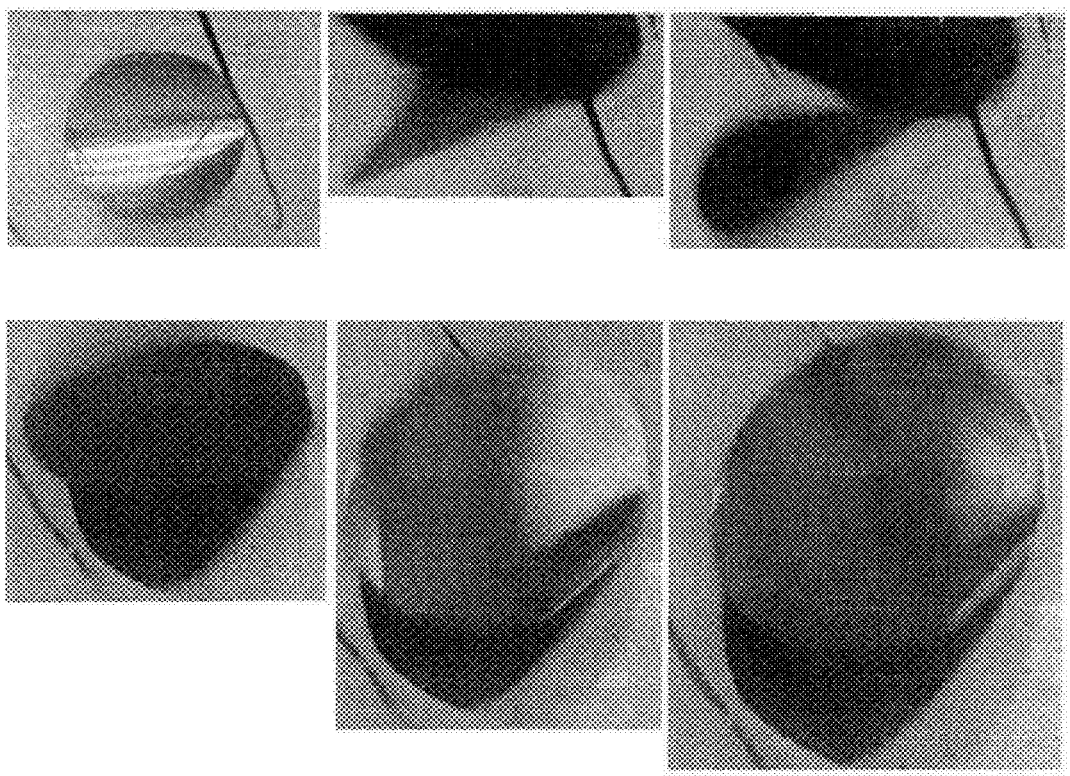

It is desired to distance the laser-damaged sacrificial layer from the interface with the surface of the GaAs wafer in order to avoid or lessen the damage to the GaAs substrate. FIG. 33 shows the laser-ablated layer (Quantum Well) having the lowest bandgap in the structure in the middle of the SiGe layer, which is removed for example about 10 µm from either the GaAs wafer surface or the solar cell. However, as the only known material with the lowest bandgap that can be grown epitaxially on GaAs is Ge, which is not significantly different from $Si_{0.02}Ge_{0.98}$, it is expected that the laser absorption would still occur in the immediate vicinity of the GaAs/SiGe interface. For this reason, it is preferred to replace the bulk of the sacrificial SiGe layer with a GaAs buffer layer, which is for example about 20 µm thick and to confine the SiGe absorption layer to the central region, as shown in FIG. 34. A suitable SiGe layer thickness is 1-2 µm. The incorporation of InGaP protection layers on both sides of the GaAs buffer layer offers the best protection to the GaAs substrate and the solar cell. The details of the InGaP protection layers are shown in the inset of FIG. 34. The InGaP protection layer can suitably be made of a GaAs layer sandwiched between two $In_{0.49}Ga_{0.51}P$ layers, for example about 0.1 µm each, as taught by [34].

Integration and Packaging of III-V Solar Cells

Figure 26:
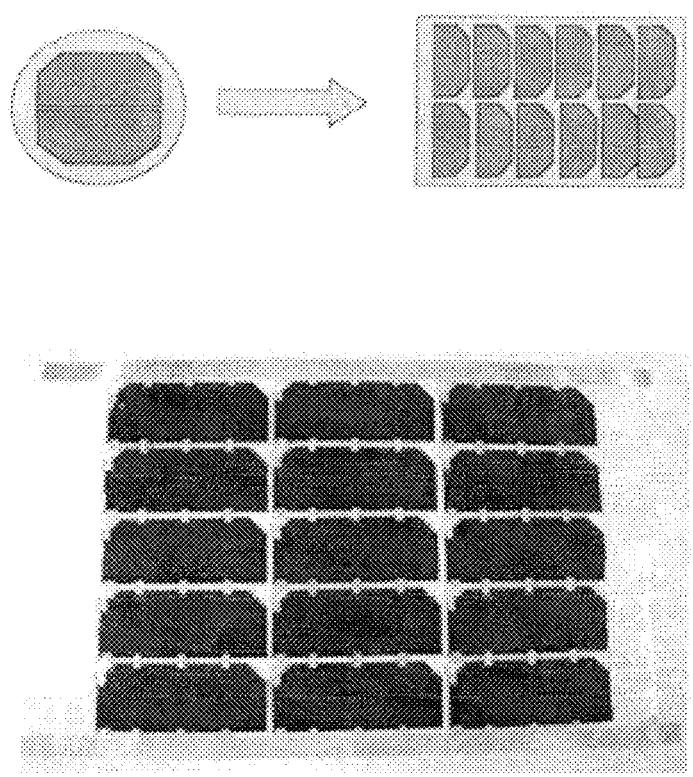

A GaAs wafer with IMM3J epi-layer capped with a metal layer is bonded face down to Kapton substrate and trimmed. After lift-off a typical 4" wafer is diced to yield two trapezoidal solar cells for space applications having dimensions of approximately 4 cm×6.6 cm (area 26.6 cm$^2$). Several cells are integrated on a common blanket polyimide sheet and interconnected, as shown schematically in FIG. 26.

Figure 27:
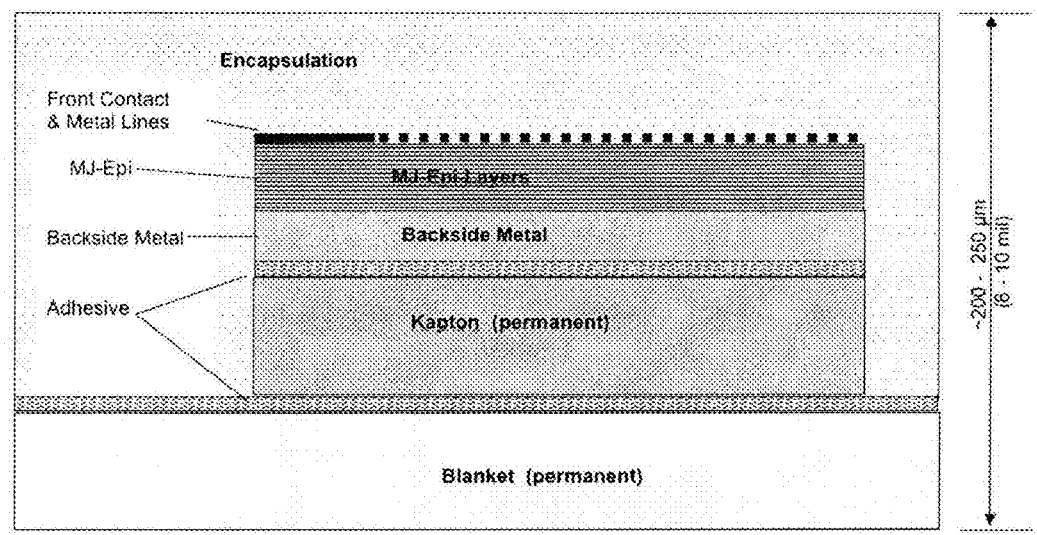
FIG. 27 illustrates schematically packaged and encapsulated 8-layer solar cell.

The thin encapsulated solar cell structure is shown schematically in FIG. 27 and has a total thickness of 200-250 µm. Adhesive layers are used on either side of the Kapton® layer to attach the IMM cell to the blanket polyimide sheet. This avoids the use of copper cladded substrates and reduces the weight of the blanket considerably.

Figure 28:
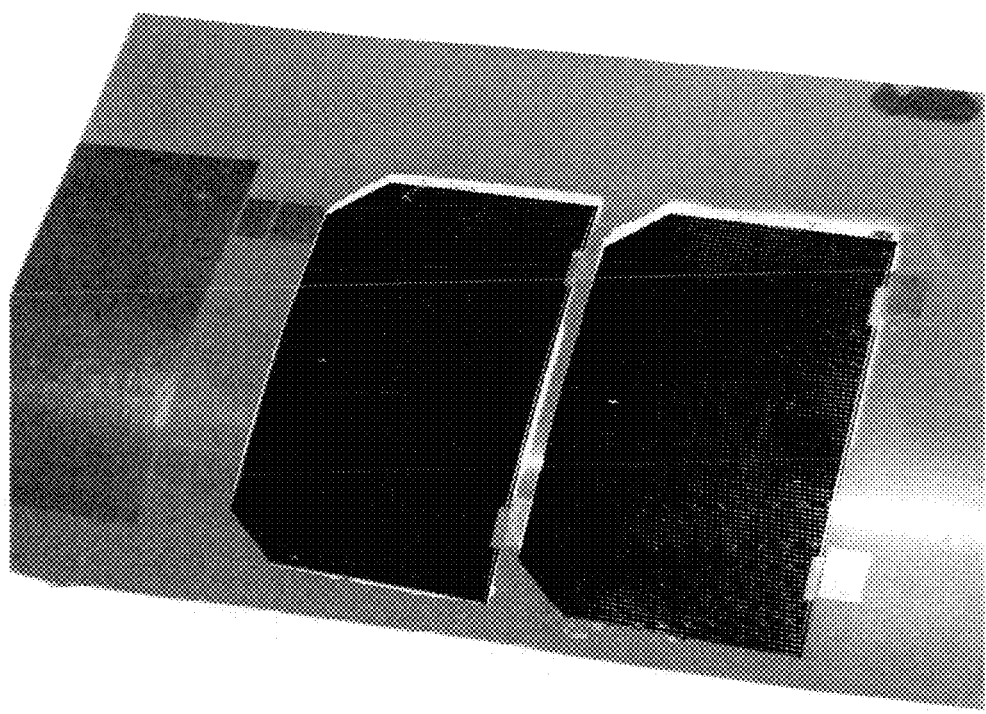
FIG. 28 Two cells integrated on copper-cladded polyimide sheet with ECA (white)

Solar cells were integrated on copper-cladded polyimide sheet using electrically conductive adhesive (ECA) which makes full face contact with the backside metal layer, and interconnected using induction soldering, as shown in FIG. 28. However, the fragile solar cell must be supported at all times with a Kapton substrate (yellow in FIG. 27) after removal of the GaAs wafer. This prevents full face contact with the ECA. Furthermore, the ECA has high contact resistance, and delaminated upon rolling. For this reason, it is preferred to contact both sides of the epi-layer from the top of the wafer, as shown schematically in FIG. 29 with a copper ribbon.

Figure 29A:
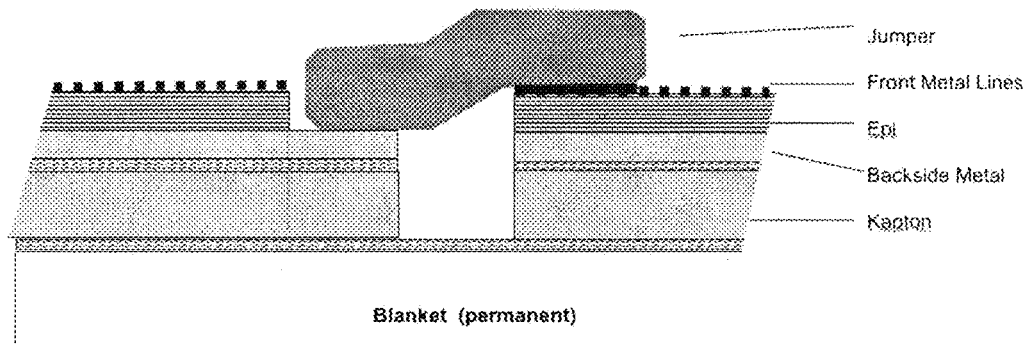
FIG. 29a Contacting both sides of IMM cell from the top of the wafer.
Figure 29B:
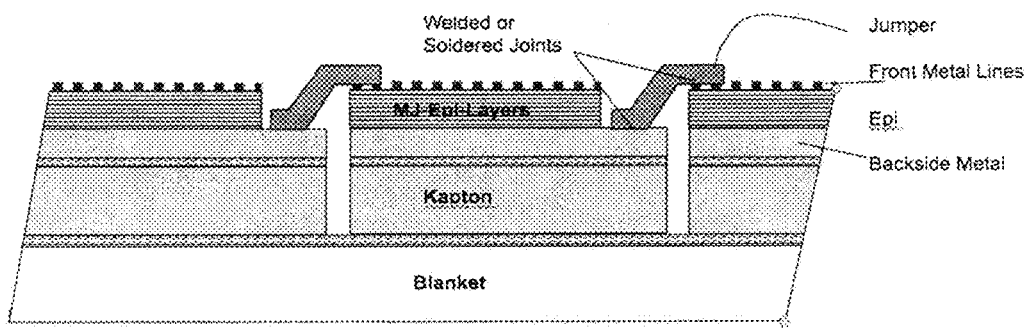
FIG. 29b Interconnecting of several IMM cells in series.

The backside metal layer can be accessed from the top at the GaAs/metal interface by etching a few mm$^2$ of the GaAs epi-layer to expose the top of the metal layer during processing of the front side, as shown in FIG. 29a. Subsequently, contact is made between the backside of one solar cell and the front side of the next cell by copper plating. This will mitigate the risk of breaking the thin epi-layer while contacting. The final assembly of the solar cell is shown in FIG. 29b. Both sides of the epi-layer are contacted from the top side of the wafer. This eliminates the need for copper cladded substrates and ECA. Simple non-cladded polymeric blanket sheet can be used with organic adhesive layers (grey cross-hatched layer).

A solar cell was encapsulated with Imiclear (previously Corin® XLS) layer available from Hybrid Plastics, Inc in Hattiesburg, Miss. ImiClear is a spray-on fluorinated polyimide nano-composite, which was developed to replace the cover glass for space applications. It has the combination of transparency and UV resistance and ruggedness that make it suitable for space applications. It can be sprayed-on to a thickness between 25 and 50 µm and does not perturb the balance of the structure. It is applied at room temperature and therefore does not exert any thermal stress on the thin solar cell. This provides a process for fabricating a thin flexible solar cell, interconnecting the front and backsides, integrating several cells on a common blanket polyimide sheet, and encapsulating, which applies to both inverted and non-inverted cells.

Figure 30A:
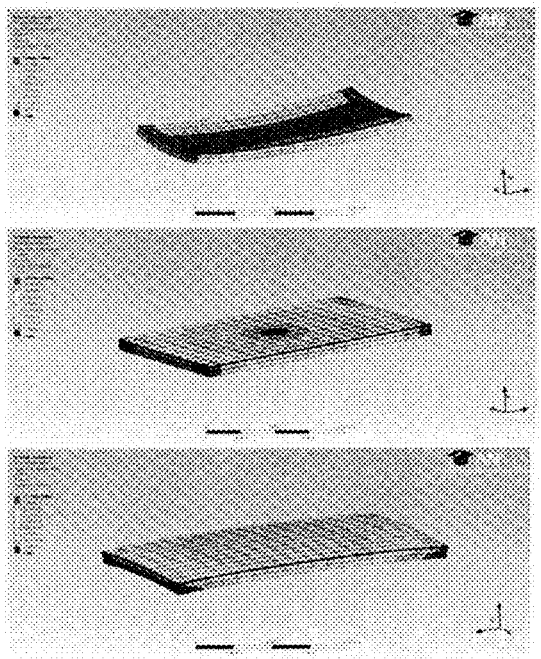
FIG. 30a Deformations of solar cell structure of FIG. 27 at −200° C. for Spray-on Polyimide Thickness of 25 μm, at different CTE's, flat at CTE=16.5 ppm/° C.
Figure 30B:
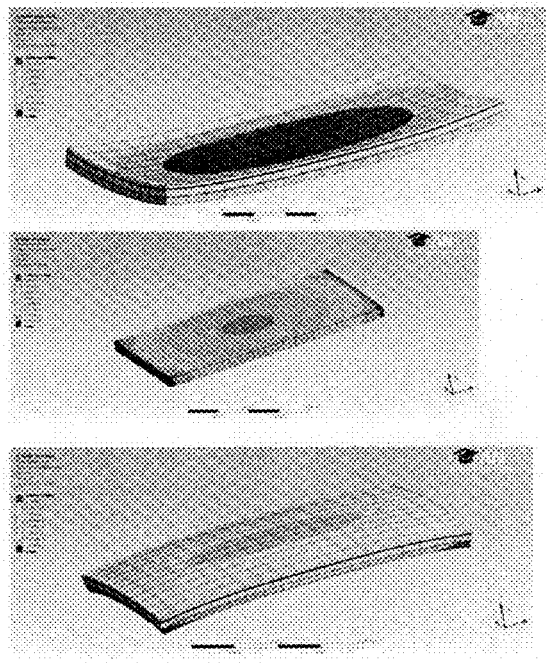
FIG. 30b Deformations of solar cell structure of FIG. 27 at −200° C. for Spray-on Polyimide Thickness of 50 μm, at different CTE's, flat at CTE=20 ppm/° C.

It is necessary to flatten the structure of a multi-layer solar cell over a wide temperature range to encompass temperature swings that are encountered on orbit. ANSYS simulation was used to balance the 8-layer solar cell structure of FIG. 27, over a temperature range of 300° C. from +100° C. to −200° C. by varying the CTE of the blanket polyimide sheet. FIGS. 30a and 30b show the deformations of the 8-layer structure at −200° C. for spray-on polyimide thickness of 25 μm and 50 μm, respectively.

For spray-on polyimide thickness of 25 μm, a CTE of 16.5 ppm/° C. flattens the structure, whereas for spay-on polyimide thickness of 50 μm, a CTE of 20 ppm/° C. flattens the structure. Below this CTE the structure bends upward, whereas above this CTE the structure bends downward. For the value of CTE that balances the structure, the solar cell remains flat over the entire temperature range from +100° C. to −200° C. Thus, the solar cell structure can be balanced over the entire temperature range.

Controlling the thickness of the spray-on polyimide cover layer within a fraction of a mil is crucial as it affects the transparency and degree of protection of the cell. A change in thickness of only half of a mil (12.5 μm) causes a shift in the UV cut-off wavelength of 15 nm, which can be critical for the performance of the cell. The thickness of spray-on polyimide is controlled precisely by concentration and duration of the spray. Furthermore, the value of the CTE of the blanket polyimide layer required to stress-balance the structure depends on the thickness of the ImiClear cover layer. The 8-layer solar cell structure can be balanced using Novastrat® variable-CTE polyimide, which is available commercially from Nexolve, Inc which is a division of Mantech SRS in Huntsville, Ala.

A typical triple junction solar cell for space applications produces about 2.2 V and generates a current of 0.45 A at the Maximum Power Point (MPPT), which corresponds to a power output of about 1 W. Thus, producing a total power of 100 KW requires the use of one hundred thousand cells and an area of 300 m². At least 100 cells must be connected in series to produce a voltage >200 V, i.e. 1000 cells can be connected in parallel. High voltage operation is advantageous because it lowers the ohmic power loss.

Eliminating the need for copper cladded substrate reduces the weight of the blanket sheet. Also the fill factor of the blanket is increased by tiling the cells tightly together and reducing the gap between adjacent cells to less than 100 μm. A polyimide blanket sheet 50 μm thick yields a specific power ratio >_200 W/Kg and stowed volume efficiency >100 kW/m³, suitable for space applications. This yields robust foldable/rollable high efficiency photovoltaic blankets made of IMM cells that are fully encapsulated which remain flat in orbit and which meet the specific power and volume target requirements.

Process for Integrating and Packaging Lifted-Off Solar Cells

The lifted-off solar cells are integrated on a common blanket polyimide sheet and interconnected in series and parallel using copper electroplating. The process starts by bonding the epi-wafer to Kapton® polyimide substrate in a clean room and then lifting-off the epi-layer using either laser or crack propagation, as described above. After lift-off the thin IMM structures are processed into fully functional solar cells and a new IMM structure is grown on the original GaAs wafer. Anti-reflection coating (ARC) is deposited and metal lines are patterned on the front side of the IMM cell on Kapton to create metal landing pads. A small volume (10 μm×10 μm×10 μm) is etched at the point of interconnect on the edge of the epi-layer as shown schematically in FIG. 29, to enable access to the backside metal layer. The processing is done wafer scale. Then the wafer is diced to yield two trapezoidal shaped cells. The front side of the solar cell must be protected while mounting on the back side blanket sheet. The solar cells are aligned and mounted on UV tape, such as dicing tape, about 160 μm thick and laid down on the blanket polyimide sheet. The Mylar sheet protective backing is peeled off the backside of the Kapton to expose the adhesive before mounting on the blanket polyimide sheet. Kapton also comes coated with a uniform film of acrylic adhesive 25 μm thick on both sides, similar to double-sided tape, can be used to facilitate attachment of the Kapton to the epi with metal layer and the blanket sheet. This is a product made by DuPont called Pyralux®. The assembly is then heated at 150-200° C. for about an hour under the weight of a few pounds to activate and cure the adhesive layer. The front side tape is then removed by UV exposure. At this point the cells are ready for interconnect by electroplating. The final step in the process is encapsulation by spraying of ImiClear polyimide to the desired thickness.

The initial bonding of the epi-layer to Kapton by lamination and the electroplating after assembly are done in a clean room. A standard sheet of polyimide (8½"×11") accommodates 2 rows of 6 cells (6.6 cm×4 cm each), i.e. 6 series and 2 parallel connections. Automated equipment can be used to process in a roll to roll format using 1,000 foot×12" rolls of polyimide.

Figure 31:
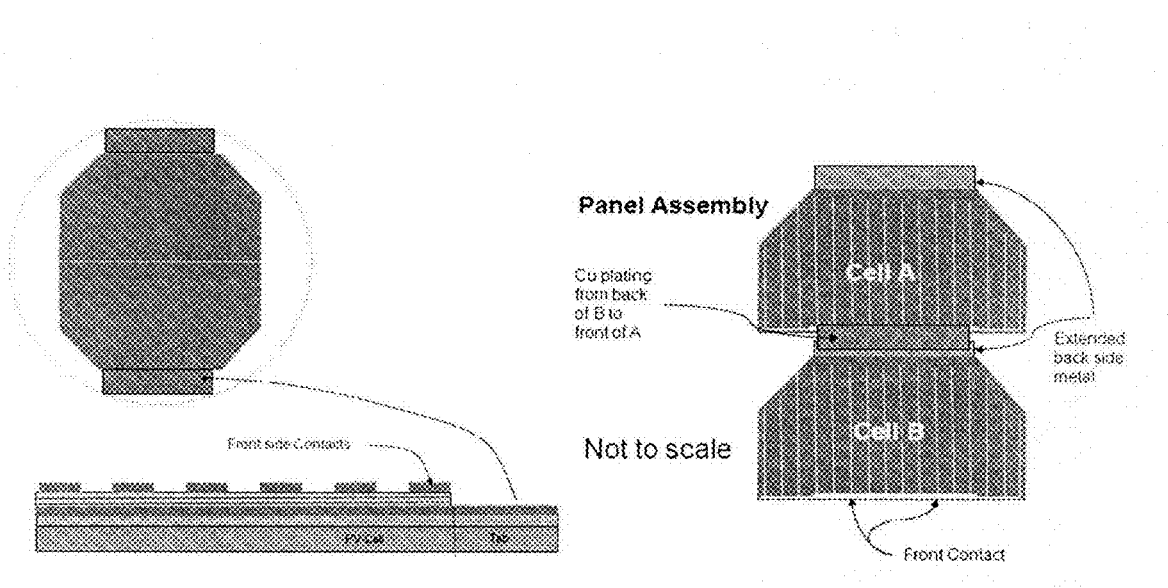
FIG. 31 Top view of the interconnect region between two adjacent cells.
Figure 32:
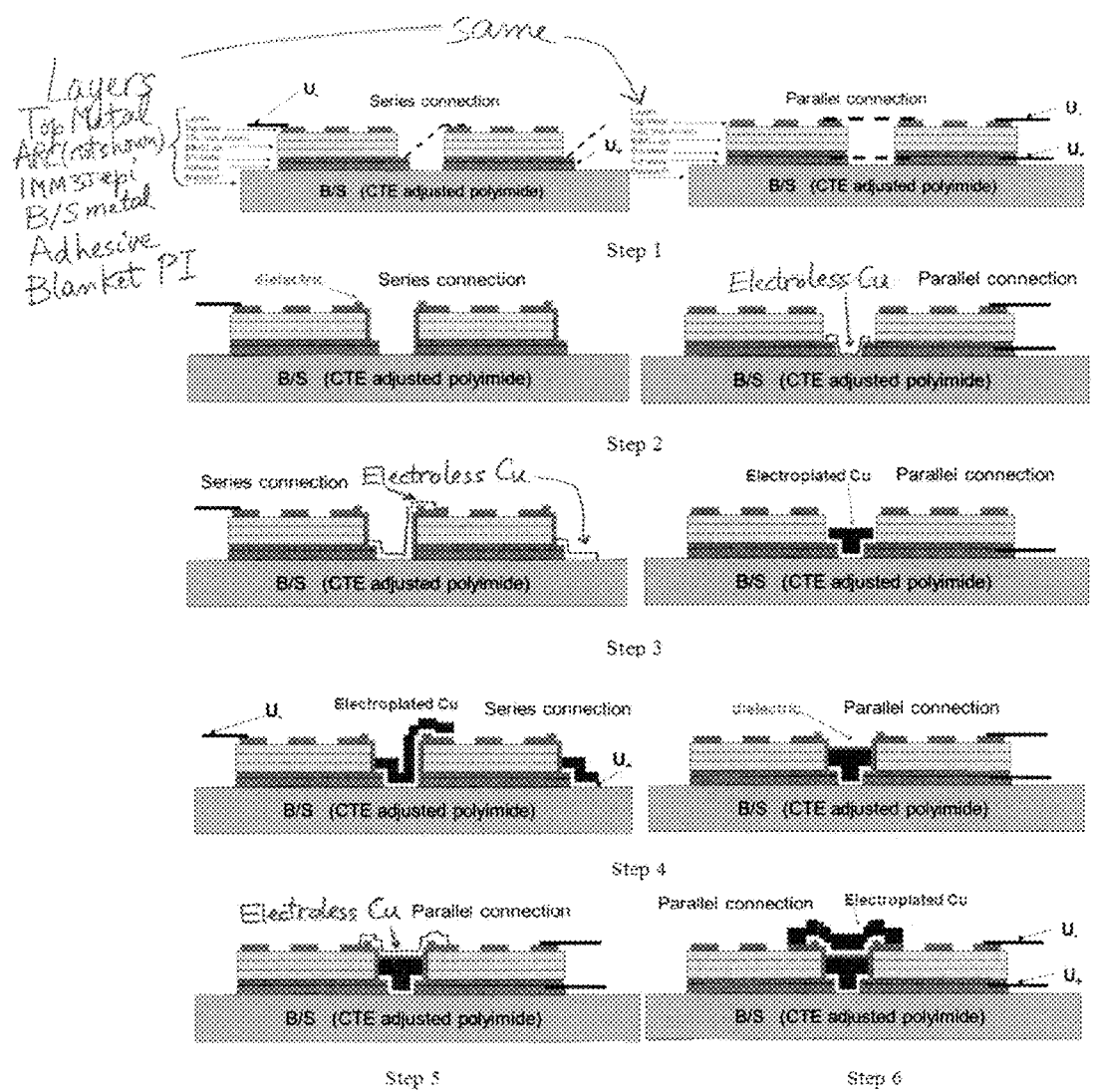
FIG. 32 Process for electroplating series and parallel connections.

FIG. 31 shows the extension of the backside metal layer beyond the epi-layer and a top view of the interconnect region between two adjacent cells. The cells are interconnected using standard procedures that are well established in the semiconductor industry. FIG. 32 illustrates the process for series connection (steps 1-4, left column) and for parallel connection (steps 1-6, right column). Step 1 illustrates the connections conceptually.

Process for Electroplating Series Connection

The process starts by coating all surfaces with photoresist, exposing through a mask, and developing leaving all surfaces covered except those that will be coated with dielectric. The samples are then coated with a thin layer of dielectric using Atomic Layer Deposition (ALD), which is particularly effective at coating side walls and sharp edges. All the surfaces are coated with dielectric, including the photoresist. After the photoresist is dissolved the remaining dielectric is shown in Step 2. Subsequently, a second coat of photoresist is applied and patterned, leaving only some areas exposed for electroless Cu plating. Submerging the samples in electroless Cu coats the entire assembly with a thin layer of Cu. Dissolving the second photoresist and the overlying Cu, a thin Cu layer remains over the dielectric in the areas shown in Step 3. This step creates a continuous electrical path from one cell to the next.

The assembly is then coated with a third layer of photoresist, exposed through a mask and developed; leaving exposed the surfaces that will be electroplated. The samples are submerged in an electroplating bath and Cu is plated to the desired thickness in the areas shown in Step 4. The remaining photoresist is finally removed. Electroplating allows much tighter spacing in the placement of the cells compared to other interconnect methods and a much smaller area of the epi-layer needs to be etched away. The IMM cell would not survive immersion in a plating bath unless it is protected by photoresist.

Process for Electroplating Parallel Connection

Step 1 (right column) illustrates the concept of connecting two neighboring cells in parallel, which is slightly different from the series connection. There is no need for dielectric coating at the beginning because the two connected metals are at the same level. Electroless Cu is deposited directly after patterning to connect the back side metals, as shown in Step 2, which is followed by electroplating copper by applying a potential to the interconnected back side metal layers in step 3. This is followed by patterning the areas to be covered by a dielectric layer and dielectric deposition using ALD in step 4. The parallel connection requires a second electroless Cu deposition, as shown in Step 5. Finally, the cells are patterned and electroplated one more time, as shown in Step 6. These steps require photoresist deposition, patterning and removal three times as in the series connection. The completed and interconnected cells will be encapsulated using spray-on polyimide.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed:

1. A method for separating an epitaxially grown layer from a GaAs growth substrate comprising:
    growing an epitaxial sacrificial layer between said epitaxially grown layer and said GaAs substrate having substantially the same lattice constant,
    irradiating said substrate, epitaxially grown layer and sacrificial layer with electromagnetic radiation having a wavelength, pulse width and pulse energy, wherein said electromagnetic radiation is predominantly absorbed in said sacrificial layer,
    breaking atomic bonds in said sacrificial layer with said electromagnetic radiation, thereby separating said epitaxially grown layer from said GaAs growth substrate.

2. The method of claim 1 wherein said epitaxially grown layer is made of III-V compounds.

3. the method of claim 2 wherein said epitaxially grown layer is an inverted multi-junction solar cell.

4. The method of claim 3 wherein said inverted multi-junction solar cell is all lattice matched to said GaAs substrate.

5. The method of claim 2 wherein said electromagnetic radiation is predominantly absorbed in said sacrificial layer, and not causing substantial damage to said GaAs substrate or said epitaxially grown layer.

6. The method of claim 2 wherein said epitaxially grown layer is a light emitting diode (LED).

7. The method of claim 1 wherein said sacrificial layer is made of 2% Si and 98% Ge.

8. The method of claim 1 wherein said electromagnetic radiation emanates from a femtosecond laser.

9. The method of claim 1 wherein said GaAs substrate has a polished backside and said electromagnetic radiation is incident on said polished backside of said GaAs substrate opposite said epitaxially grown layer.

10. The method of claim 1 wherein said epitaxial sacrificial layer comprising a SiGe layer sandwiched between two GaAs buffer layers.

11. The method of claim 10 wherein said SiGe layer has a thickness between 1 and 2 μm.

12. The method of claim 10 wherein said GaAs buffer layer has a thickness of about 10 μm.

13. The method of claim 10 wherein said SiGe layer and said GaAs buffer layers are sandwiched between two InGaP protection layers.

14. The method of claim 13 wherein said InGaP protection layers are made of three layers comprising a GaAs layer sandwiched between two InGaP layers.

15. The method of claim 14 wherein said InGaP layers are made of 49% Indium and 51% Gallium and Phosphide, matching the lattice constant of GaAs.

16. The method of claim 15 wherein said GaAs layer and said InGaP layers are about 0.1 μm thick.

17. The method of claim 1 wherein a cross-section of said electromagnetic radiation covers an area equivalent to a 4-inch GaAs substrate.

18. The method of claim 1 wherein said breaking atomic bonds is obtained by irradiating with a single pulse.

19. The method of claim 1 wherein said electromagnetic radiation emanates from a nanosecond Nd:YAG laser emitting in the NIR at a wavelength of about 1.064 μm.

20. The method of claim 19 wherein said nanosecond laser has a pulse width between 1 and 10 nanoseconds.

* * * * *